(12) United States Patent
Endo et al.

(10) Patent No.: US 9,202,822 B2
(45) Date of Patent: Dec. 1, 2015

(54) SEMICONDUCTOR DEVICE AND MANUFACTURING METHOD THEREOF

(75) Inventors: Yuta Endo, Kanagawa (JP); Toshinari Sasaki, Kanagawa (JP); Kosei Noda, Kanagawa (JP); Hitomi Sato, Kanagawa (JP); Yuhei Sato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 183 days.

(21) Appl. No.: 13/316,604

(22) Filed: Dec. 12, 2011

(65) Prior Publication Data

US 2012/0153275 A1 Jun. 21, 2012

(30) Foreign Application Priority Data

Dec. 17, 2010 (JP) ................................. 2010-282166

(51) Int. Cl.
*H01L 27/12* (2006.01)
*H01L 29/49* (2006.01)
*H01L 29/786* (2006.01)

(52) U.S. Cl.
CPC ........ *H01L 27/1225* (2013.01); *H01L 29/4908* (2013.01); *H01L 29/7869* (2013.01)

(58) Field of Classification Search
CPC .................................................. H01L 29/4908
USPC .......................................................... 257/43
See application file for complete search history.

(56) References Cited

U.S. PATENT DOCUMENTS

| 5,528,032 A | 6/1996 | Uchiyama |
| 5,731,856 A | 3/1998 | Kim et al. |
| 5,744,864 A | 4/1998 | Cillessen et al. |
| 5,903,053 A * | 5/1999 | Iijima et al. .................. 257/751 |

(Continued)

FOREIGN PATENT DOCUMENTS

| EP | 1453088 A | 9/2004 |
| EP | 1 737 044 A1 | 12/2006 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Yu-Hsi D Sun
*Assistant Examiner* — Ankush Singal
(74) *Attorney, Agent, or Firm* — Fish & Richardson P.C.

(57) ABSTRACT

To manufacture a transistor whose threshold voltage is controlled without using a backgate electrode, a circuit for controlling the threshold voltage, and an impurity introduction method. To manufacture a semiconductor device having favorable electrical characteristics, high reliability, and low power consumption using the transistor. A gate electrode including a tungsten oxide film whose composition is controlled is used. The composition or the like is adjusted by a film formation method of the tungsten oxide film, whereby the work function can be controlled. By using the tungsten oxide film whose work function is controlled as part of the gate electrode, the threshold of the transistor can be controlled. Using the transistor whose threshold voltage is controlled, a semiconductor device having favorable electrical characteristics, high reliability, and low power consumption can be manufactured.

27 Claims, 18 Drawing Sheets

(56) References Cited

U.S. PATENT DOCUMENTS

| | | |
|---|---|---|
| 6,294,274 B1 | 9/2001 | Kawazoe et al. |
| 6,462,723 B1 | 10/2002 | Yamazaki et al. |
| 6,515,336 B1* | 2/2003 | Suzawa et al. ............... 257/350 |
| 6,563,174 B2 | 5/2003 | Kawasaki et al. |
| 6,727,522 B1 | 4/2004 | Kawasaki et al. |
| 7,045,406 B2* | 5/2006 | Huotari et al. ............... 438/198 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,135,732 B2* | 11/2006 | Iwasaki et al. ............... 257/302 |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 7,973,313 B2 | 7/2011 | Arai et al. |
| 8,193,532 B2 | 6/2012 | Arai et al. |
| 8,274,077 B2 | 9/2012 | Akimoto et al. |
| 8,298,839 B2* | 10/2012 | Kasahara ...................... 438/22 |
| 8,318,554 B2 | 11/2012 | Arai et al. |
| 8,466,463 B2 | 6/2013 | Akimoto et al. |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 9,099,562 B2 | 8/2015 | Akimoto et al. |
| 2001/0046027 A1 | 11/2001 | Tai et al. |
| 2002/0042167 A1* | 4/2002 | Chae ........................... 438/149 |
| 2002/0056838 A1 | 5/2002 | Ogawa |
| 2002/0093046 A1* | 7/2002 | Moriya et al. ............... 257/315 |
| 2002/0109161 A1* | 8/2002 | Chou et al. .................... 257/253 |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0026410 A1* | 2/2005 | Yamazaki et al. ............ 438/597 |
| 2005/0045889 A1* | 3/2005 | Fryer et al. .................... 257/72 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0110900 A1* | 5/2006 | Youn et al. .................... 438/592 |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0246633 A1 | 11/2006 | Arai et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0085476 A1* | 4/2007 | Hirakata et al. ............... 313/506 |
| 2007/0090365 A1 | 4/2007 | Hayashi et al. |
| 2007/0096189 A1* | 5/2007 | Iwasaki et al. ............... 257/306 |
| 2007/0108446 A1 | 5/2007 | Akimoto |
| 2007/0152217 A1 | 7/2007 | Lai et al. |
| 2007/0163617 A1* | 7/2007 | Ozaki et al. .................... 134/1.1 |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252234 A1* | 11/2007 | Kawamata et al. ........... 257/506 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0011426 A1* | 1/2008 | Chua ........................ 156/345.48 |
| 2008/0038882 A1 | 2/2008 | Takechi et al. |
| 2008/0038929 A1 | 2/2008 | Chang |
| 2008/0042128 A1* | 2/2008 | Furukawa et al. ............... 257/40 |
| 2008/0050595 A1 | 2/2008 | Nakagawara et al. |
| 2008/0073653 A1 | 3/2008 | Iwasaki |
| 2008/0076216 A1* | 3/2008 | Pae et al. ........................ 438/257 |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203477 A1* | 8/2008 | Yamazaki et al. ............ 257/347 |
| 2008/0224133 A1 | 9/2008 | Park et al. |
| 2008/0230178 A1* | 9/2008 | Ishitani et al. ................ 156/295 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0266509 A1* | 10/2008 | Nishi et al. .................... 349/153 |
| 2008/0296568 A1 | 12/2008 | Ryu et al. |
| 2008/0308805 A1 | 12/2008 | Akimoto et al. |
| 2008/0315286 A1* | 12/2008 | Ieda ............................. 257/316 |
| 2009/0008639 A1* | 1/2009 | Akimoto et al. ............... 257/43 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0148971 A1* | 6/2009 | Fujii et al. ....................... 438/29 |
| 2009/0152506 A1 | 6/2009 | Umeda et al. |
| 2009/0152541 A1 | 6/2009 | Maekawa et al. |
| 2009/0236581 A1* | 9/2009 | Yoshida et al. .................. 257/2 |
| 2009/0236624 A1* | 9/2009 | Shin ................................ 257/98 |
| 2009/0278122 A1 | 11/2009 | Hosono et al. |
| 2009/0280600 A1 | 11/2009 | Hosono et al. |
| 2010/0062592 A1* | 3/2010 | Clark ............................ 438/591 |
| 2010/0065844 A1 | 3/2010 | Tokunaga |
| 2010/0092800 A1 | 4/2010 | Itagaki et al. |
| 2010/0102311 A1* | 4/2010 | Ito et al. .......................... 257/43 |
| 2010/0102312 A1* | 4/2010 | Yamazaki et al. ............... 257/43 |
| 2010/0109002 A1 | 5/2010 | Itagaki et al. |
| 2010/0139365 A1* | 6/2010 | Fix et al. ...................... 73/23.31 |
| 2010/0149851 A1* | 6/2010 | Asami et al. .................... 365/72 |
| 2010/0207113 A1* | 8/2010 | Kasahara ........................ 257/40 |
| 2011/0012117 A1* | 1/2011 | Yamazaki et al. ............... 257/59 |
| 2011/0031469 A1* | 2/2011 | Yamazaki et al. ................ 257/5 |
| 2011/0031499 A1* | 2/2011 | Kimura et al. .................. 257/59 |
| 2011/0089417 A1* | 4/2011 | Yamazaki et al. ............... 257/43 |
| 2011/0104851 A1 | 5/2011 | Akimoto et al. |
| 2011/0121284 A1* | 5/2011 | Yamazaki et al. ............... 257/43 |
| 2011/0121290 A1 | 5/2011 | Akimoto et al. |
| 2011/0140089 A1* | 6/2011 | Terao ............................. 257/40 |
| 2011/0140205 A1* | 6/2011 | Sakata et al. .................. 257/411 |
| 2011/0147754 A1* | 6/2011 | Isa et al. ........................ 257/60 |
| 2011/0147755 A1* | 6/2011 | Miyairi et al. ................. 257/60 |
| 2011/0186853 A1 | 8/2011 | Terai et al. |
| 2011/0204427 A1* | 8/2011 | Choi et al. .................... 257/296 |
| 2011/0215288 A1* | 9/2011 | Matsui et al. ..................... 257/2 |

(56) References Cited

U.S. PATENT DOCUMENTS

| | | | | |
|---|---|---|---|---|
| 2012/0161123 | A1* | 6/2012 | Yamazaki | 257/43 |
| 2012/0171864 | A1* | 7/2012 | Akiyama et al. | 438/675 |
| 2012/0231580 | A1* | 9/2012 | Yamazaki et al. | 438/104 |
| 2013/0009147 | A1* | 1/2013 | Koyama et al. | 257/43 |
| 2013/0037799 | A1* | 2/2013 | Sakata et al. | 257/43 |
| 2013/0157422 | A1* | 6/2013 | Yamazaki | 438/158 |

FOREIGN PATENT DOCUMENTS

| | | |
|---|---|---|
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2 226 847 A2 | 9/2010 |
| JP | 59-214262 A | 12/1984 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-096744 A | 4/1994 |
| JP | 06-275697 A | 9/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-282050 A | 10/2004 |
| JP | 2006-237624 A | 9/2006 |
| JP | 2006-332606 A | 12/2006 |
| JP | 2007-096055 A | 4/2007 |
| JP | 2009-174056 A | 8/2009 |
| JP | 2010-267975 A | 11/2010 |
| JP | 2011-159908 A | 8/2011 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

(56) References Cited

OTHER PUBLICATIONS

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

(56) References Cited

OTHER PUBLICATIONS

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Eri Fukumoto et al.; "High Mobility Oxide Semiconductor TFT for Circuit Integration of AM-OLED"; IDW '10 : Proceedings of the 16th International Display Workshops; Dec. 1, 2010; pp. 631-634.

\* cited by examiner

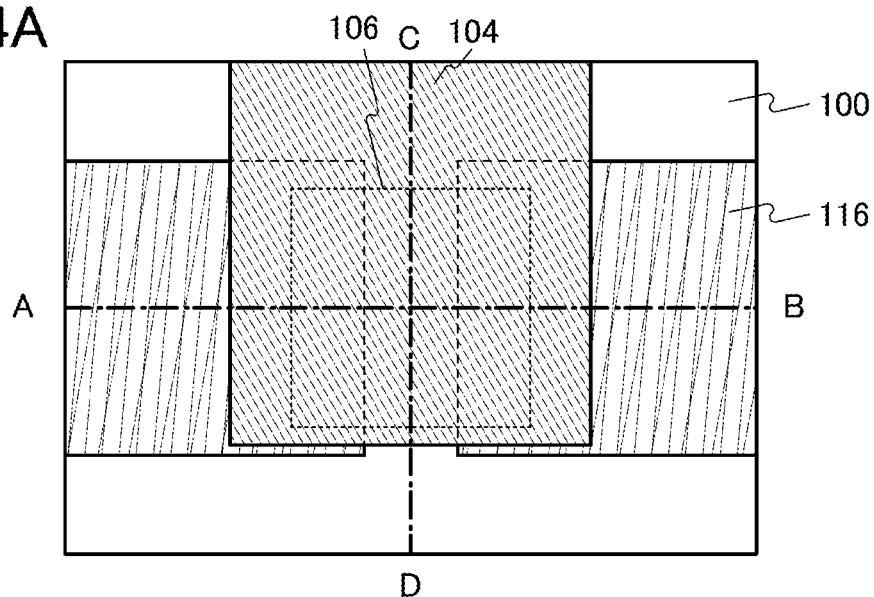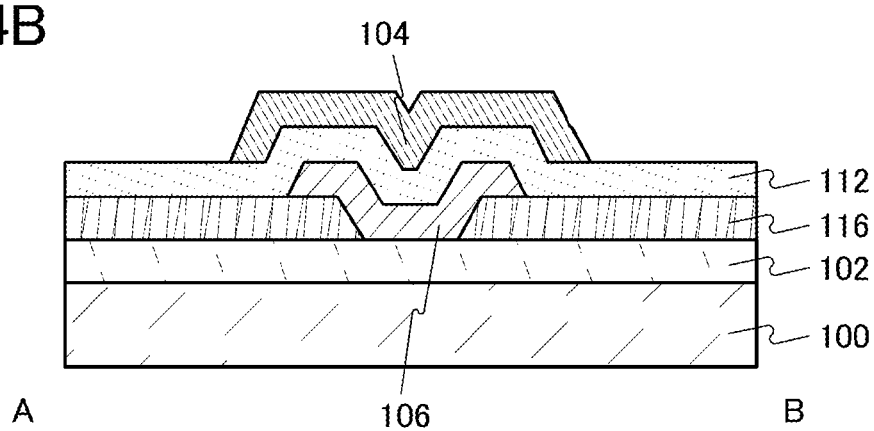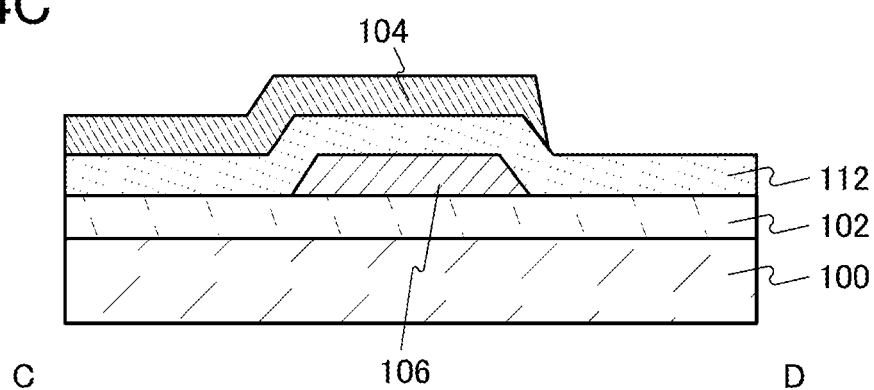

SEMICONDUCTOR DEVICE AND MANUFACTURING METHOD THEREOF

BACKGROUND OF THE INVENTION

1. Field of the Invention

The present invention relates to a semiconductor device and a manufacturing method of the semiconductor device.

In this specification, a semiconductor device means any device that can function by utilizing semiconductor characteristics; a semiconductor display device, a semiconductor circuit, an electronic device are all included in the category of the semiconductor device. 2. Description of the Related Art A technique by which transistors are formed using a semiconductor thin film formed over a substrate having an insulating surface has been attracting attention. Such transistors are applied to a wide range of electronic devices such as an integrated circuit (IC) or an image display device (display device). As materials of semiconductor thin films applicable to the transistors, there are silicon-based semiconductor materials and oxide semiconductor materials.

For example, amorphous silicon, microcrystalline silicon, polycrystalline silicon, an In—Ga—Zn—O-based oxide semiconductor, and the like are used as active layers of transistors.

Controlling the threshold voltage ($V_{th}$) of a transistor is important in terms of on/off characteristics of the transistor. For example, when the threshold voltage is close to 0 V in a transistor, the voltage at which the transistor is turned on can be low, leading to low power consumption.

Patent Document 1 discloses a semiconductor device including a plurality of transistors each including a backgate electrode, a semiconductor active layer provided in contact with the backgate electrode with a first gate insulating film interposed therebetween, and a gate electrode provided in contact with the semiconductor active layer with a second gate insulating film interposed therebetween; and a threshold voltage control circuit which controls the threshold voltage of the plurality of transistors; and a technique in which the threshold voltage is controlled by application of an arbitrary voltage to the back gate electrode by the threshold voltage control circuit.

For example, in the case of using a silicon-based semiconductor material for an active layer, the threshold voltage can be controlled by introducing a Group 13 element or a Group 15 element into the active layer; however, it is known that the introduction of a Group 13 element or a Group 15 element reduces the crystallinity and causes impurity scattering and the like, leading to degradation of transistor characteristics.

Non-Patent Document 1 discloses a technique in which molybdenum oxide is formed on a surface by plasma oxidation of a Mo gate electrode to increase the work function of the gate electrode, so that the threshold voltage shifts to the positive side. This technique shifts the threshold voltage to the positive side but has problems of low resistance of the molybdenum oxide to a later plasma process and recession of the molybdenum oxide layer.

REFERENCE

[Patent Document]

[Patent Document 1] Japanese Published Patent Application No. 2006-237624

[Non-Patent Document]

[Non-Patent Document 1] Eri Fukumoto et al., "High Mobility Oxide Semiconductor TFT for Circuit Integration of AM-OLED", IDW'10, pp. 631-634

SUMMARY OF THE INVENTION

An object is to manufacture a transistor whose threshold voltage is controlled without using a backgate electrode, a circuit for controlling the threshold voltage, and an impurity introduction method. An object is to manufacture a semiconductor device having favorable electrical characteristics, high reliability, and low power consumption using the transistor. Further, an object is to form a gate electrode material applicable to the transistor.

An embodiment of the present invention is a semiconductor device which includes a gate electrode including a tungsten oxide film, a gate insulating film part of which in contact with the tungsten oxide film, a semiconductor film which overlaps with the gate electrode with the gate insulating film interposed therebetween, and a pair of conductive films part of which is in contact with the semiconductor film.

The work function of the tungsten oxide film can be controlled by adjustment of the composition of the tungsten oxide film. By using the tungsten oxide film whose work function is controlled as part of the gate electrode, the threshold voltage of the transistor can be controlled.

The composition of the tungsten oxide film can be adjusted at the time of film formation, for example.

In the case where the tungsten oxide film is formed using a sputtering method, a tungsten oxide target, a tungsten nitride target, or a tungsten target is used. By adjusting the composition of the target, the composition of the film can be controlled.

For example, the composition of the target can be adjusted by changing the mixing ratio of tungsten, tungsten dioxide, and tungsten trioxide in manufacturing the target, whereby the composition of the film obtained can be adjusted.

The composition of the film can also be adjusted by mixing tungsten nitride in the target.

In order to control the work function, a material containing one or more elements selected from Mg, Al, Ti, V, Cr, Mn, Co, Ni, Cu, Zn, Ga, Y, Zr, Nb, Mo, Ag, In, Sn, La, Ce, Nd, Hf, and Ta may be mixed in the target. For example, molybdenum oxide which is an oxide of Mo is known to have a high work function. However, molybdenum oxide is highly reactive with plasma and a chemical solution and soluble in water; thus it is hard to use molybdenum oxide as a single film. In contrast, a mixture of tungsten oxide and molybdenum oxide has lower reactivity with plasma and a chemical solution, is relatively stable, and is suitable for the control of the work function. Therefore, the mixture of tungsten oxide and molybdenum oxide is preferable due to less limitations on the process.

The composition of the film can also be adjusted by setting a solid body including any of the materials listed in the above paragraph over the target.

Alternatively, the composition of the film can be adjusted by film formation in which one or more gases selected from a rare gas (He, Ne, Ar, Kr, or Xe), oxygen, or nitrogen is used as a film formation gas. An increase in the concentration of oxygen or nitrogen in the tungsten oxide film can change the work function. Thus, the work function can be controlled with a flow rate ratio of the film formation gas.

In the case of introducing nitrogen into the tungsten oxide film, the concentration of nitrogen is preferably higher than or equal to 0.1 at % and lower than or equal to 20 at %. This is because the amount of variation in the work function of the tungsten oxide film owing to the introduction of nitrogen is small in the case where the concentration of nitrogen is lower than 0.1 at % or higher than 20 at %. It is obvious that the concentration of nitrogen in the tungsten oxide film is not limited to the above-described range and a tungsten oxide film including nitrogen at a concentration lower than 0.1 at % or higher than 20 at % can be used.

Further, the tungsten oxide film can be replaced by a tungsten nitride film in an embodiment of the present invention. That is, the work function may be controlled by the control of the concentration of nitrogen, the concentration of oxygen, or the like in the tungsten nitride film.

Alternatively, the tungsten oxide film can also be obtained by plasma treatment or thermal oxidation treatment on a metal film including tungsten. In this case, the work function can be controlled depending on conditions of the plasma treatment, conditions of the thermal oxidation treatment, heat treatment after the treatment, or the like.

In the above-described manner, with an embodiment of the present invention, a transistor whose threshold voltage is controlled without using a backgate electrode, a circuit for controlling the threshold voltage, and an impurity introduction method can be manufactured. The control of the threshold voltage of the transistor enables a reduction in the power consumption of a semiconductor device that uses an embodiment of the present invention.

An embodiment of the present invention is made by devising the gate electrode and does not increase the number of steps for manufacturing a transistor. In addition, degradation of the quality of a semiconductor film due to the impurity introduction is not caused. Therefore, a semiconductor device having favorable electrical characteristics and high reliability can be manufactured with high productivity.

A semiconductor device having favorable electrical characteristics, high reliability, and low power consumption can be manufactured with high productivity.

BRIEF DESCRIPTION OF THE DRAWINGS

In the accompanying drawings:

FIG. 4A is a top view of an example of a transistor according to an embodiment of the present invention and FIGS. 4B and 4C are cross-sectional views thereof;

DETAILED DESCRIPTION OF THE INVENTION

Figure 1A:
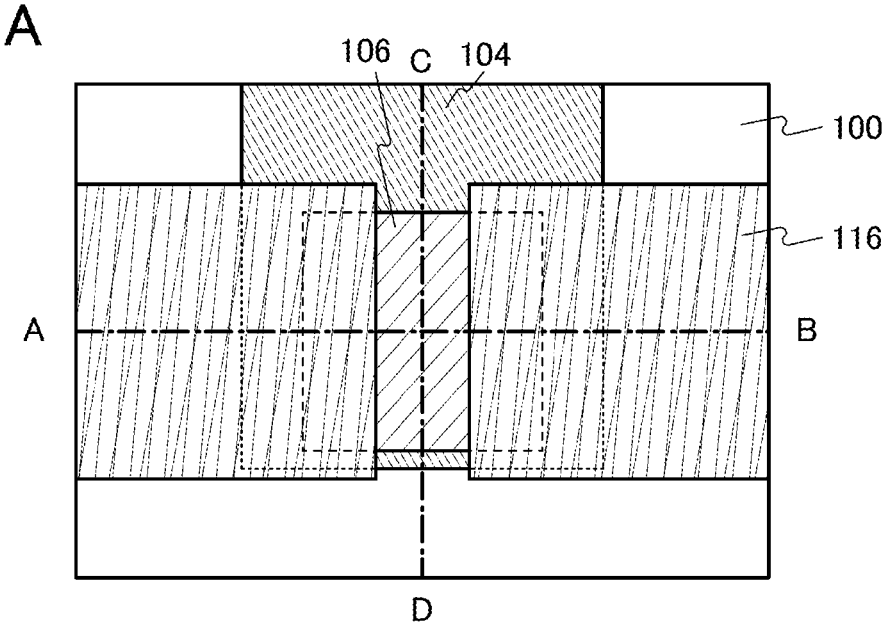
FIG 1A is a top view of an example of a transistor according to an embodiment of the present invention and FIGS. 1B and 1C are cross-sectional views thereof.

Hereinafter, embodiments of the present invention will be described in detail with reference to the accompanying drawings. However, the present invention is not limited to the following description, and it is easily understood by those skilled in the art that modes and details can be modified in various ways. Therefore, the present invention is not construed as being limited to description of the embodiments below. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

Note that voltage refers to a potential difference between a certain potential and a reference potential (e.g., a ground potential) in many cases. Accordingly, voltage, potential and a potential difference can be referred to as potential, voltage, and a voltage difference, respectively.

Even when it is written in this specification that "to be connected", there is a case in which no physical connection is made in an actual circuit and a wiring is only extended. For example, in the case of a circuit including an insulated-gate field-effect transistor (MISFET), one wiring functions as gates of a plurality of MISFETs in some cases. In that case, one wiring which branches into gates may be illustrated in a circuit diagram. Even in such a case, the expression "a wiring is connected to a gate" may be used in this specification.

Note that the ordinal numbers such as "first" and "second" are used for convenience and do not denote the order of steps or the stacking order of layers. In addition, the ordinal numbers in this specification do not denote particular names which specify the present invention.

(Embodiment 1)

A method of forming a tungsten oxide film whose composition is adjusted, which is an embodiment of the present invention, will be described.

In the case of forming a tungsten oxide film by a sputtering method, a tungsten oxide target, a tungsten nitride target, or a tungsten target is used. By adjusting the composition of the target, the composition of the film can be controlled.

For example, the composition of the target can be adjusted by changing the mixing ratio of tungsten, tungsten dioxide, or tungsten trioxide (or tungsten oxide with another valence) in manufacturing the target, whereby the composition of the film to be obtained can be adjusted. Variation in the mixing ratio of materials can produce a variety of work functions; in this manner, the work function can be controlled.

The composition of the film can also be adjusted by mixing tungsten nitride in a tungsten oxide target.

In order to control the work function, a material containing one or more elements selected from Mg, Al, Ti, V, Cr, Mn, Co, Ni, Cu, Zn, Ga, Y, Zr, Nb, Mo, Ag, In, Sn, La, Ce, Nd, Hf, and Ta may be mixed in the target. For example, molybdenum oxide which is an oxide of Mo is known to have a high work function. However, molybdenum oxide is soluble in water and thus is hard to use as a single film. A mixture of tungsten oxide and molybdenum oxide is relatively stable and suitable for the control of the work function. The work function of a molybdenum oxide film can be controlled in a manner similar to that of the tungsten oxide film. Therefore, the work function can also be controlled by mixing molybdenum oxide and tungsten oxide having controlled work functions.

The composition of the film can also be adjusted by film formation with a chip which includes any of the materials listed in the previous paragraph and is set over the target.

The composition of the film can also be adjusted by co-sputtering with the use of a plurality of cathodes.

The composition of the film can also be adjusted by film formation in which one or more gases selected from a rare gas, oxygen, or nitrogen for the tungsten oxide target is used as a film formation gas.

The composition of the film can also be adjusted by film formation in which one or more gases selected from oxygen, a rare gas, or nitrogen for the tungsten nitride target or the tungsten target is used as a film formation gas.

Alternatively, oxidation treatment, oxynitridation treatment, or nitridation treatment may be performed on a metal film including at least tungsten to form metal oxide, metal oxynitride, or metal nitride in a part. The metal film including at least tungsten may be used by mixing one or more elements selected from Mg, Al, Ti, V, Cr, Mn, Co, Ni, Cu, Zn, Ga, Y, Zr, Nb, Mo, Ag, In, Sn, La, Ce, Nd, Hf, and Ta into the tungsten.

The oxidation treatment can be plasma oxidation treatment or thermal oxidation treatment. For example, plasma may be generated by supply of electric power with an RF power source or the like using a reaction gas such as oxygen or nitrogen oxide (such as $N_2O$, NO, or $NO_2$). The plasma treatment may be carried out with a CVD apparatus, an etching apparatus, a doping apparatus, or the like. The thermal oxidation treatment may be performed in an oxidizing atmosphere at a temperature higher than or equal to 150° C. and lower than a strain point, preferably higher than or equal to 250° C. and lower than or equal to 550° C.

The oxidizing atmosphere is an atmosphere containing an oxidizing gas. The oxidizing gas is oxygen, ozone, nitrous oxide, or the like, and it is preferable that the oxidizing gas do not contain water, hydrogen, and the like. For example, the purity of oxygen, ozone, or nitrous oxide introduced into a heat treatment apparatus is 8N (99.999999%) or higher, preferably 9N (99.9999999%) or higher (i.e., the impurity concentration is 1 ppm or lower, preferably lower than 0.1 ppm). As the oxidizing atmosphere, an oxidizing gas mixed with an inert gas may be used. In that case, the mixture contains an oxidizing gas at a concentration at least greater than or equal to 10 ppm.

Here, the inert gas refers to nitrogen, a rare gas, or the like.

In the case of forming a tungsten oxide film by performing plasma treatment on a metal film including tungsten, heat treatment is preferably performed after the plasma treatment. The heat treatment can change the composition or crystallinity of the tungsten oxide film and also increase the work function.

In the plasma treatment, an electric power more than or equal to 25 W and less than or equal to 1500 W is supplied. Preferably, an electric power more than or equal to 300 W and less than or equal to 800 W is supplied. Alternatively, the direct-current voltage (VDC) between an electrode and a substrate over which a treatment film is formed may be set to higher than or equal to 10 V and lower than or equal to 800 V, preferably higher than or equal to 50 V and lower than or equal to 500 V, and further preferably higher than or equal to 100 V and lower than or equal to 300 V.

The time for which the treatment film is exposed to the plasma treatment is more than or equal to 10 sec and less than or equal to 600 sec, preferably more than or equal to 30 sec and less than or equal to 300 sec. The work function of the treatment film can be controlled by adjusting the time for which the treatment film is exposed to the plasma treatment.

In the film formation by a sputtering method, a bias sputtering method in which a bias electric power is also applied to the substrate side may be used. By using a bias sputtering method for formation of a tungsten oxide film, the crystallinity, composition, or the like is changed; accordingly, the work function can be controlled.

With this embodiment, the work function of a tungsten oxide film can be controlled.

This embodiment can be implemented in appropriate combination with any of the other embodiments.

(Embodiment 2)

A transistor which is an embodiment of the present invention will be described with reference to FIGS. 1A to 1C.

Figure 1B:
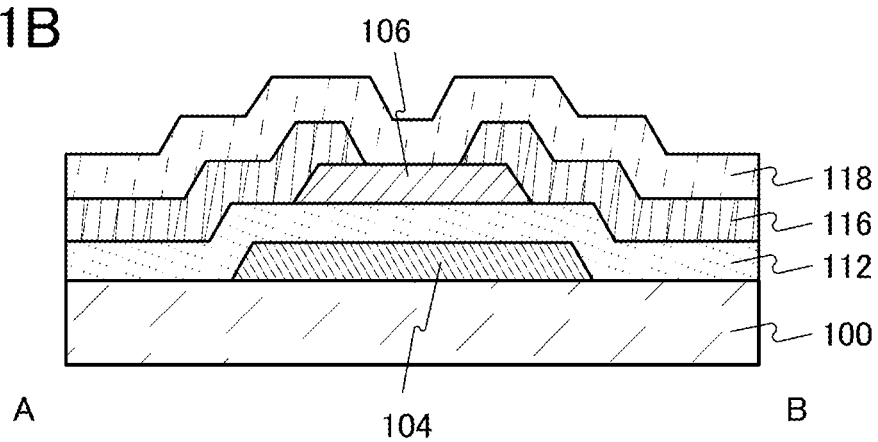
Figure 1C:
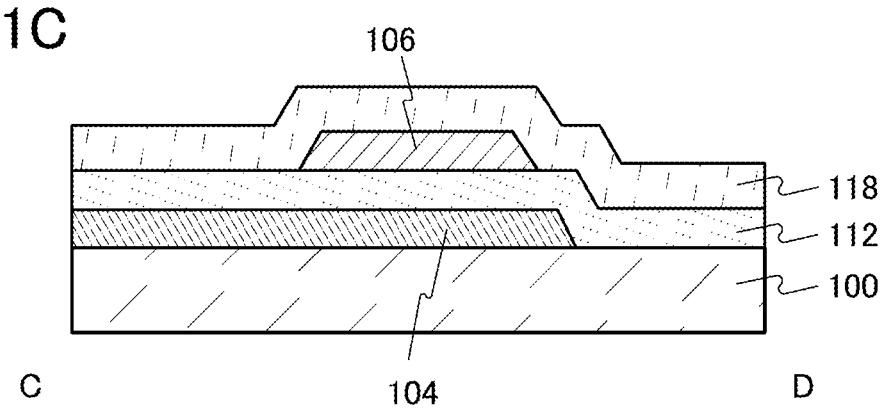

FIGS. 1A to 1C are a top view and cross-sectional views of a transistor which is an embodiment of the present invention. A cross section A-B in FIG. 1B and a cross section C-D in FIG. 1C correspond to alternate long and short dash lines A-B and C-D in FIG. 1A, respectively.

Here, the cross section A-B in FIG. 1B will be described in detail.

The cross-section A-B is a cross section of a transistor including a substrate 100, a gate electrode 104 over the substrate 100, a gate insulating film 112 that covers the substrate 100 and the gate electrode 104, a semiconductor film 106 positioned over the gate electrode 104 with the gate insulating film 112 interposed therebetween, a pair of electrodes 116 having a part in contact with the semiconductor film 106 and being over the semiconductor film 106, and an interlayer insulating film 118 that covers the gate insulating film 112, the semiconductor film 106, and the pair of electrodes 116.

Here, the gate electrode 104 includes the tungsten oxide film whose composition is adjusted and which is described in Embodiment 1. The work function of the tungsten oxide film can be controlled by the composition.

The gate electrode 104 may have a stacked-layer structure. For example, one or more materials selected from a metal of Al, Ti, Cr, Co, Ni, Cu, Y, Zr, Mo, Ag, Ta, or W, a nitride of the metal; an oxide of the metal; or an alloy of the metal is stacked together with the tungsten oxide film. In the case where the resistance of the tungsten oxide film is high, the tungsten oxide film is preferably stacked together with a low-resistance film with a sheet resistance of 10 Ω/sq or lower in order to reduce the resistance of the gate electrode 104. Note that the tungsten oxide film is arranged to be located on the gate insulating film 112 side.

Note that in FIGS. 1A to 1C, the gate electrode 104 is larger than the semiconductor film 106 in length and width when viewed from above in order to prevent light from causing deterioration of the semiconductor film 106 or electric charge generation in the semiconductor film 106; however, the present invention is not limited to this structure. An edge of the semiconductor film 106 may extend beyond an edge of the gate electrode 104.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Further alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used. Still further alternatively, any of these substrates provided with a semiconductor element may be used as the substrate 100.

A flexible substrate may alternatively be used as the substrate 100. In the case where a transistor is provided over the flexible substrate, the transistor may be formed directly on the flexible substrate, or the transistor may be formed over a different substrate and then separated from the substrate and transferred to the flexible substrate. In order to separate the transistor from the substrate and transfer it to the flexible substrate, a separation layer is preferably provided between the different substrate and the transistor.

The semiconductor film 106 may be formed using a silicon film, a germanium film, a silicon germanium film, a silicon carbide film, a gallium nitride film, or an oxide semiconductor film. The oxide semiconductor film can be formed easily and has high field-effect mobility even without laser beam irradiation treatment and the like; thus the oxide semiconductor film is preferable as the semiconductor film 106.

For example, for the oxide semiconductor film of the semiconductor film 106, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like may be used. In addition, any of the above materials may contain silicon oxide. Here, for example, an In—Ga—Zn—O-based material means an oxide containing indium (In), gallium (Ga), and zinc (Zn), and there is no particular limitation on the composition ratio. Further, the In—Ga—Zn—O-based oxide semiconductor may contain an element other than In, Ga, and Zn.

Further, a material represented by $InMO_3(ZnO)_m$ (m>0) may be used for the oxide semiconductor film. Here, M represents one or more metal elements selected from Ga, Al, Mn, and Co. For example, M may be Ga, Ga and Al, Ga and Mn, Ga and Co, or the like.

The gate insulating film 112 and the interlayer insulating film 118 may be formed to have a stacked-layer structure or a single-layer structure using, for example, silicon oxide, silicon oxynitride, silicon nitride oxide, silicon nitride, aluminum oxide, hafnium oxide, yttrium oxide, or zirconium oxide. For example, the gate insulating film 112 and the interlayer insulating film 118 may be formed using a thermal oxidation method, a CVD method, a sputtering method, or the like. As the gate insulating film 112 and the interlayer insulating film 118, a film from which oxygen is released by heating may be used. With use of such an insulating film from which oxygen is released by heating for the gate insulating film 112 and the interlayer insulating film 118, defects generated in the semiconductor film 106 can be repaired and electrical characteristics of the transistor can be inhibited from being degraded.

In this specification, silicon oxynitride refers to a substance that contains more oxygen than nitrogen and for example, silicon oxynitride includes oxygen, nitrogen, silicon, and hydrogen at concentrations ranging from greater than or equal to 50 at % and less than or equal to 70 at %, greater than or equal to 0.5 at % and less than or equal to 15 at %, greater than or equal to 25 at % and less than or equal to 35 at %, and greater than or equal to 0 at % and less than or equal to 10 at %, respectively. Further, silicon nitride oxide refers to a substance that contains more nitrogen than oxygen and for example, silicon nitride oxide includes oxygen, nitrogen, silicon, and hydrogen at concentrations ranging from greater than or equal to 5 at % and less than or equal to 30 at %, greater than or equal to 20 at % and less than or equal to 55 at %, greater than or equal to 25 at % and less than or equal to 35 at %, and greater than or equal to 10 at % and less than or equal to 25 at %, respectively. Note that rates of oxygen, nitrogen, silicon, and hydrogen fall within the above ranges in the cases where measurement is performed using Rutherford backscattering spectrometry (RBS) or hydrogen forward scattering spectrometry (HFS). In addition, the total of the percentages of the constituent elements does not exceed 100 at %.

In the case where a material of the pair of electrodes 116 diffuses into the semiconductor film 106 to adversely affect transistor characteristics, an insulating film in which the diffusion coefficient of the material of the pair of electrodes 116 is low may be used as the gate insulating film 112 and the interlayer insulating film 118. The interlayer insulating film 118 functions as a protective film for the semiconductor film 106.

"To release oxygen by heating" means that the amount of released oxygen is greater than or equal to $1.0 \times 10^{18}$ atoms/$cm^3$, preferably greater than or equal to $3.0 \times 10^{20}$ atoms/$cm^3$ in thermal desorption spectroscopy (TDS) on an oxygen atom basis.

Here, a method for measuring the amount of released oxygen on an oxygen atom basis using TDS analysis will be described.

The amount of released gas in TDS analysis is proportional to the integral value of a spectrum. Therefore, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be calculated according to Equation 1 using the TDS analysis results of a silicon wafer containing hydrogen at a predetermined density, which is the standard sample, and the TDS analysis results of the insulating film. Here, all spectra having a mass number of 32 which are obtained by the TDS analysis are assumed to originate from an oxygen molecule. $CH_3OH$ can be given as another gas having a mass number of 32, but is not taken into consideration on the assumption that it is unlikely to be present. Further, an oxygen molecule including an oxygen atom having a mass number of 17 or 18, which is an isotope of an oxygen atom, is also not taken into consideration because the proportion of such a molecule in the natural world is minimal.

$$N_{O2}=N_{H2}/S_{H2} \times S_{O2} \times a \quad \text{(Equation 1)}$$

$N_{H2}$ is the value obtained by conversion of the number of hydrogen molecules released from the standard sample into density. $S_{H2}$ is an integral value of a spectrum of the standard sample which is analyzed by TDS. Here, the reference value of the standard sample is set to $N_{H2}/S_{H2}$. $S_{O2}$ is an integral value of a spectrum when the insulating film is analyzed by TDS. a is a coefficient affecting the intensity of the spectrum in the TDS analysis. For details of Equation 1, Japanese Published Patent Application No. H6-275697 can be referred to. Note that the amount of released oxygen from the above insulating film is measured with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

Further, in the TDS analysis, part of oxygen is detected as an oxygen atom. The ratio between oxygen molecules and oxygen atoms can be calculated from the ionization rate of oxygen molecules. Note that, since the above a includes the ionization rate of oxygen molecules, the number of the released oxygen atoms can also be estimated through the evaluation of the number of the released oxygen molecules.

Note that $N_{O2}$ is the number of the released oxygen molecules. The amount of released oxygen on an oxygen atom basis is twice the number of the released oxygen molecules.

In the above structure, the film from which oxygen is released by heating may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

When oxygen is supplied to the semiconductor film 106, which is an oxide semiconductor film, from the gate insulating film 112 or the interlayer insulating film 118, the interface state density between the semiconductor film 106 and the gate insulating film 112 or the interface state density between the semiconductor film 106 and the interlayer insulating film 118 can be reduced. As a result, capture of electric charge at the interface between the semiconductor film 106 and the gate insulating film 112 and the interface between the semiconductor film 106 and the interlayer insulating film 118 due to operation of a transistor or the like can be suppressed. Thus, a transistor with less electrical characteristic deterioration can be provided.

Further, electric charge may be generated owing to oxygen vacancies in the oxide semiconductor film in some cases. In general, part of oxygen vacancies in the oxide semiconductor film serves as a donor to generate an electron that is a carrier. As a result, the threshold voltage of the transistor shifts in the negative direction. Sufficient release of oxygen from the gate insulating film 112 or the interlayer insulating film 118 to the semiconductor film 106 that is the oxide semiconductor film can compensate oxygen vacancies in the oxide semiconductor film which is a cause of the negative shift of the threshold voltage.

In other words, by providing the film from which oxygen is released by heating as the gate insulating film 112 or the interlayer insulating film 118, the interface state density between the semiconductor film 106 and the gate insulating film 112, the interface state density between the semiconductor film 106 and the interlayer insulating film 118, and oxygen vacancies in the semiconductor film 106 which is an oxide semiconductor film can be reduced, whereby the influence of the capture of electric charge in the semiconductor film 106 which is an oxide semiconductor film, at the interface of the gate insulating film 112, or at the interface of the interlayer insulating film 118 can be reduced.

For the pair of electrodes 116, any of the metals, metal nitrides, metal oxides, or metal alloys, which can be used for the gate electrode 104, can be used as appropriate. The pair of electrodes 116 functions as source and drain electrodes of the transistor.

When a film including Cu is used for the pair of electrodes 116, the wiring resistance can be reduced, and wiring delay or the like can be prevented even in a large-sized display device or the like. In the case of using Cu for the pair of electrodes 116, the adhesion depends on the material of the substrate 100; in such a case, it is preferable to employ a stacked-layer structure using a film having favorable adhesion property to the substrate 100. As the film having favorable adhesion property to the substrate 100, a film including Ti, Mo, Mn, Cu, or Al may be used. For example, a Cu—Mn—Al alloy may be used.

In the above-described manner, a transistor whose threshold voltage is controlled can be provided. Therefore, a semiconductor device having favorable electrical characteristics, high reliability, and low power consumption can be manufactured at high productivity.

This embodiment can be implemented in appropriate combination with any of the other embodiments.

(Embodiment 3)

In this embodiment, a transistor having a structure different from that of the transistor described in Embodiments 2 will be described.

Figure 2A:
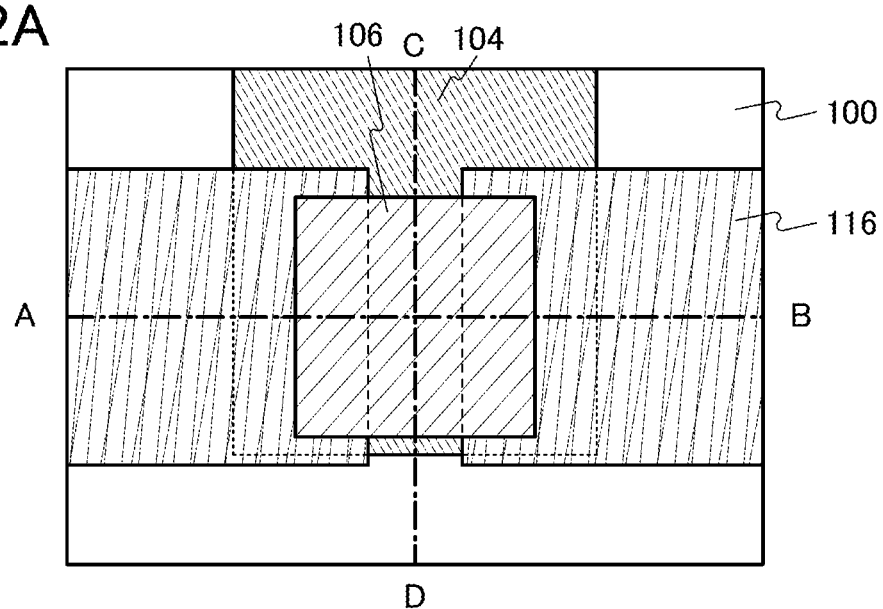
FIG. 2A is a top view of an example of a transistor according to an embodiment of the present invention and FIGS. 2B and 2C are cross-sectional views thereof.
Figure 2B:
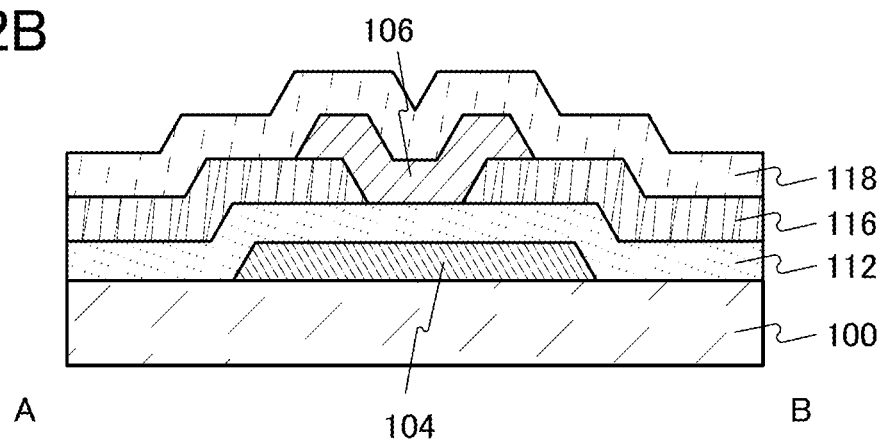
Figure 2C:
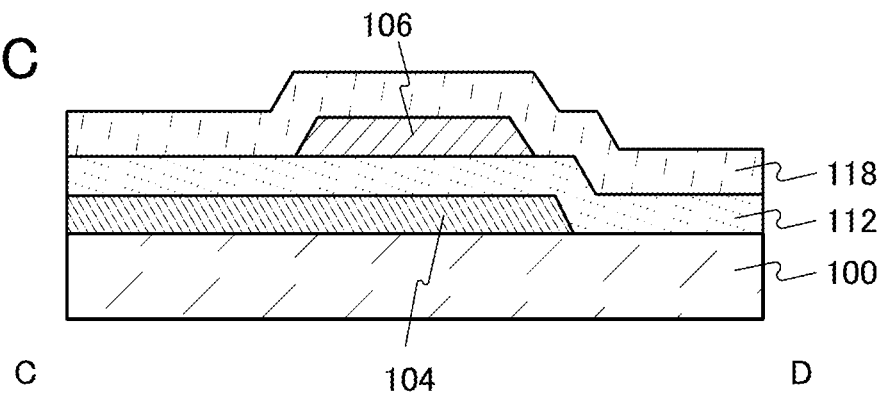

FIGS. 2A to 2C are a top view and cross-sectional views of a transistor which is an embodiment of the present invention. A cross section A-B in FIG. 2B and a cross section C-D in FIG. 2C correspond to alternate long and short dash lines A-B and C-D in FIG. 2A, respectively.

The cross section A-B in FIG. 2B will be described in detail below.

The cross-section A-B is a cross section of a transistor including a substrate 100, a gate electrode 104 over the substrate 100, a gate insulating film 112 that covers the substrate 100 and the gate electrode 104, a pair of electrodes 116 over the gate insulating film 112, a semiconductor film 106 having a part in contact with the pair of electrodes 116 and being over the pair of electrodes 116, and an interlayer insulating film 118 that covers the gate insulating film 112, the pair of electrodes 116, and the semiconductor film 106.

The gate electrode 104 in this embodiment has a structure similar to that of the gate electrode 104 in Embodiment 2. By using the gate electrode including the tungsten oxide film described in Embodiment 1, the work function can be controlled; accordingly, the threshold voltage of the transistor can be controlled. In the case that the gate electrode 104 has a stacked-layer structure, the tungsten oxide film is arranged to be located on the gate insulating film 112 side.

Figure 3A:
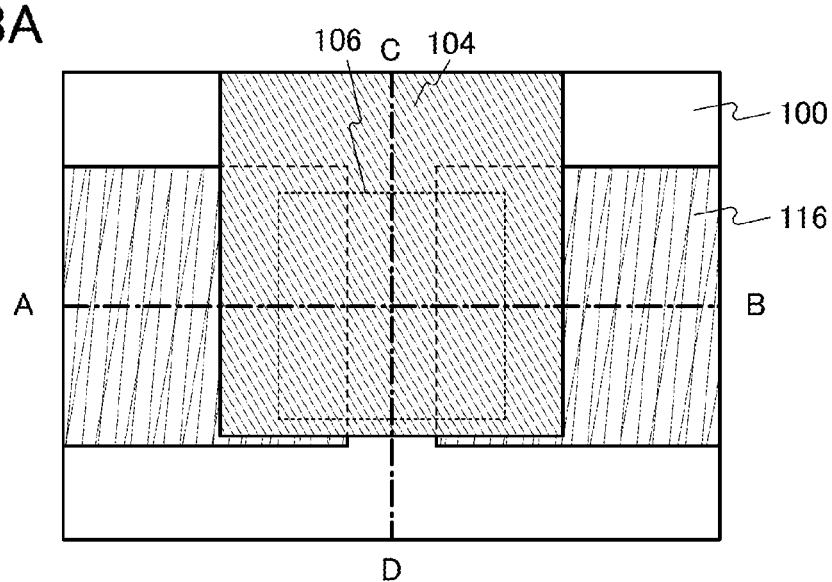
FIG. 3A is a top view of an example of a transistor according to an embodiment of the present invention and FIGS. 3B and 3C are cross-sectional views thereof.
Figure 3B:
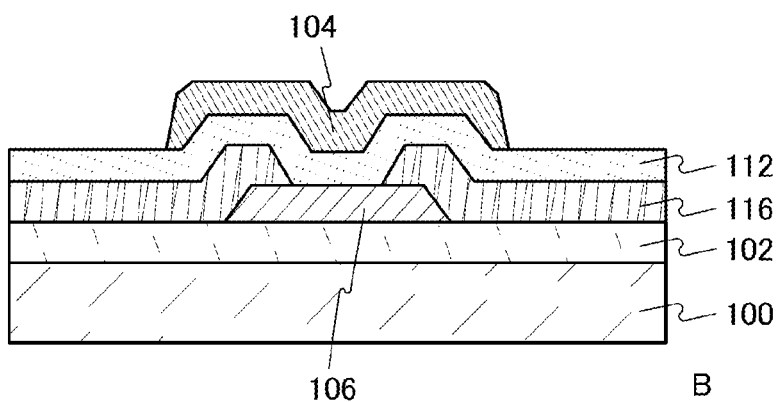
Figure 3C:
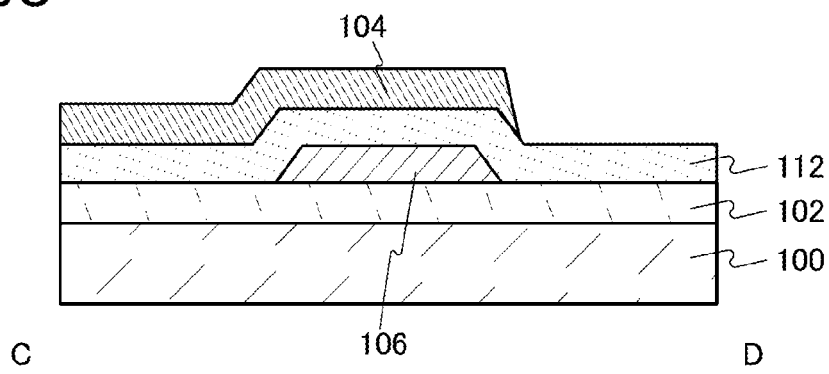

FIGS. 3A to 3C are a top view and cross-sectional views of a transistor which is an embodiment of the present invention. A cross section A-B in FIG. 3B and a cross section C-D in FIG. 3C correspond to alternate long and short dash lines A-B and C-D in FIG. 3A, respectively.

The cross section A-B in FIG. 3B will be described in detail below.

The cross-section A-B is a cross section of a transistor including a substrate 100, a base insulating film 102 over the substrate 100, a semiconductor film 106 over the base insulating film 102, a pair of electrodes 116 having a part in contact with the semiconductor film 106 and being over the semiconductor film 106, a gate insulating film 112 that covers the semiconductor film 106 and the pair of electrodes 116, and a gate electrode 104 positioned over the semiconductor film 106 with the gate insulating film 112 interposed therebetween.

The base insulating film 102 can have a structure similar to those of the gate insulating film 112 and the interlayer insulating film 118.

FIGS. 4A to 4C are a top view and cross-sectional views of a transistor which is an embodiment of the present invention. A cross section A-B in FIG. 4B and a cross section C-D in FIG. 4C correspond to alternate long and short dash lines A-B and C-D in FIG. 4A, respectively.

The cross section A-B in FIG. 4B will be described in detail below.

The cross-section A-B is a cross section of a transistor including a substrate 100, a base insulating film 102 over the substrate 100, a pair of electrodes 116 over the base insulating film 102, a semiconductor film 106 having a part in contact with the pair of electrodes 116 and being over the pair of electrodes 116, a gate insulating film 112 that covers the semiconductor film 106 and the pair of electrodes 116, and a gate electrode 104 positioned over the semiconductor film 106 with the gate insulating film 112 interposed therebetween.

Note that in FIGS. 2A to 2C, FIGS. 3A to 3C, and FIGS. 4A to 4C, the gate electrode 104 is larger than the semiconductor film 106 in length and width when viewed from above in order to prevent light from causing deterioration of the semiconductor film 106 or electric charge generation in the semiconductor film 106; however, the present invention is not limited to this structure. An edge of the semiconductor film 106 may extend beyond an edge of the gate electrode 104.

Figure 5A:
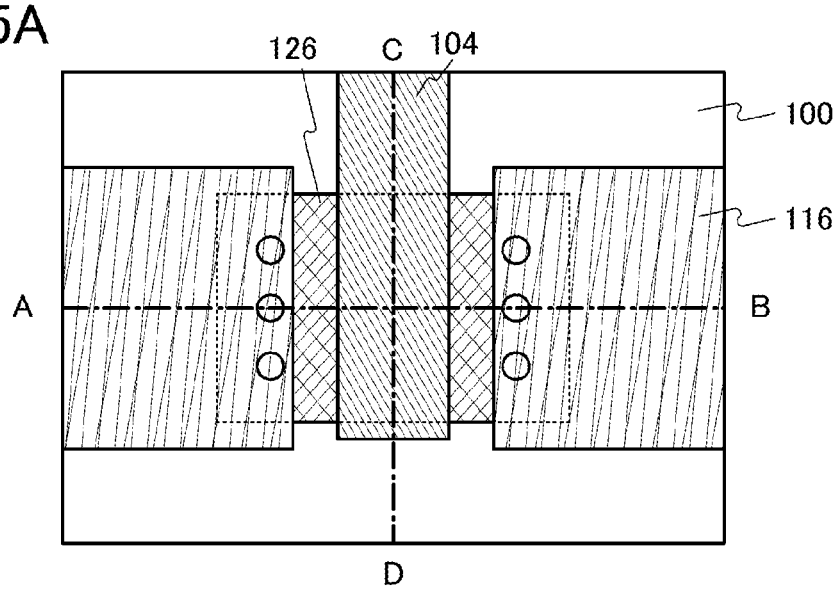
FIG. 5A is a top view of an example of a transistor according to an embodiment of the present invention and FIGS. 5B and 5C are cross-sectional views thereof.
Figure 5B:
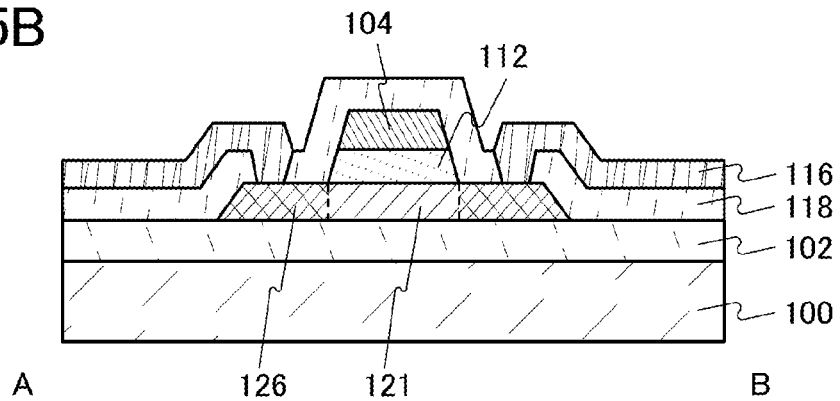
Figure 5C:
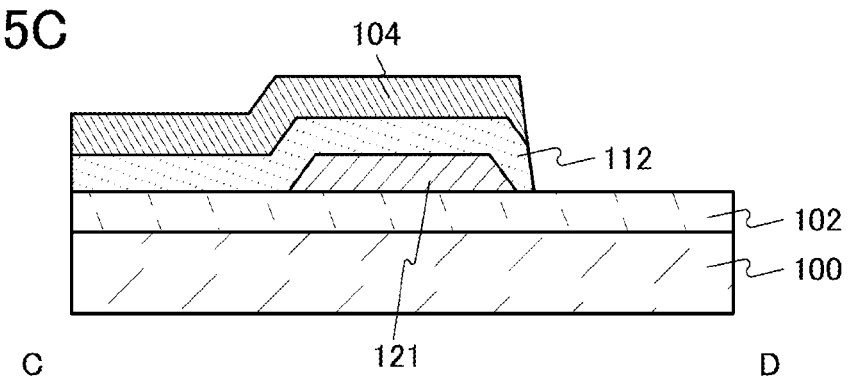

FIGS. 5A to 5C are a top view and cross-sectional views of a transistor which is an embodiment of the present invention. A cross section A-B in FIG. 5B and a cross section C-D in FIG. 5C correspond to alternate long and short dash lines A-B and C-D in FIG. 5A, respectively.

The cross section A-B in FIG. 5B will be described in detail below.

The cross-section A-B is a cross section of a transistor including a substrate 100, a base insulating film 102 over the substrate 100, a semiconductor film including a region 126 and a region 121 over the base insulating film 102, a gate insulating film 112 over the region 121, a gate electrode 104 over the gate insulating film 112, an interlayer insulating film 118 that covers the base insulating film 102, the region 126, the gate insulating film 112, and the gate electrode 104, and a pair of electrodes 116 which is in contact with the region 126 at an opening that is provided in the interlayer insulating film 118 and exposes the region 126.

Here, the gate insulating film 112 and the gate electrode 104 may be formed using the same mask to have substantially the same shape when viewed from above. Note that after formation of the gate electrode 104 and the gate insulating film 112, the width of the gate electrode 104 may be reduced by plasma treatment or chemical treatment.

Although the gate insulating film 112 and the gate electrode 104 have substantially the same shape when viewed from above in FIGS. 5A to 5C, the present invention is not limited to this structure. For example, a structure in which the gate insulating film 112 covers the semiconductor film including the region 121 and the region 126 may also be employed.

The region 121 may be formed using the gate insulating film 112 or the gate electrode 104 as a mask in forming the region 126 to have substantially the same shape when viewed from above as the gate insulating film 112 or the gate electrode 104. For example, an impurity (such as boron, phosphorus, hydrogen, a rare gas, or nitrogen) is introduced into the semiconductor film using the gate insulating film 112 or the gate electrode 104 as a mask, a region whose resistance has been reduced can be referred to as the region 126. Note that the region 121 is a region except for the region 126 in the semiconductor film.

The region 121 functions as a channel region of the transistor. Further, the region 126 has a function as a source region or a drain region of the transistor.

Figure 6A:
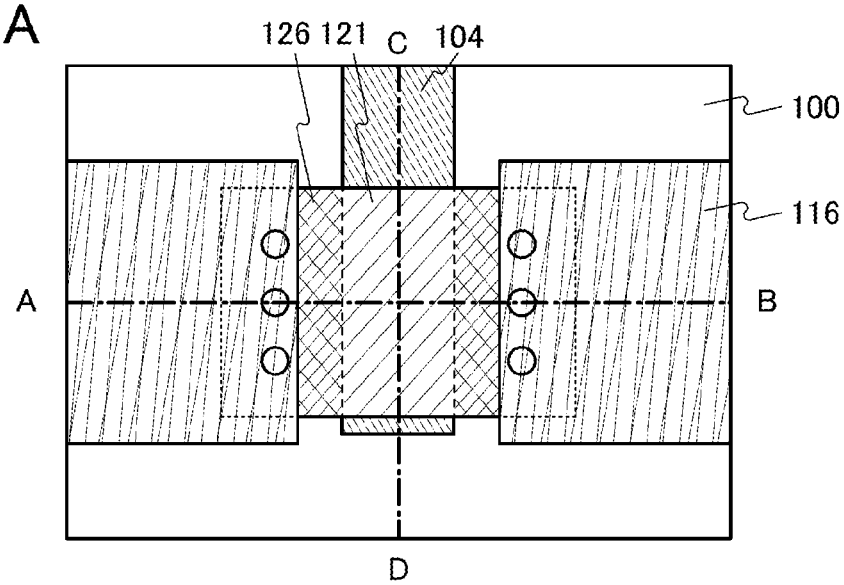
FIG. 6A is a top view of an example of a transistor according to an embodiment of the present invention and FIGS. 6B and 6C are cross-sectional views thereof.
Figure 6B:
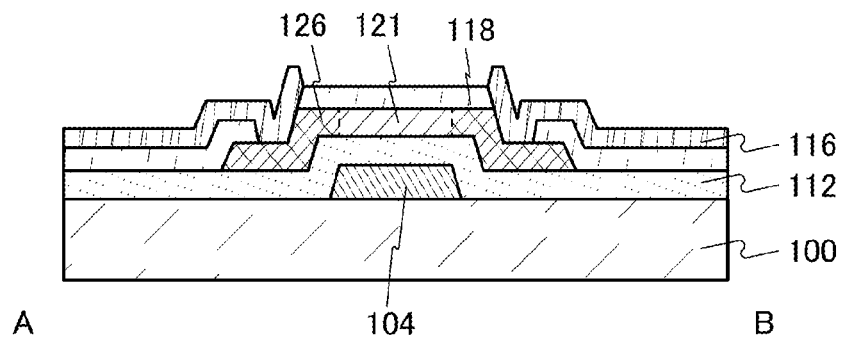
Figure 6C:
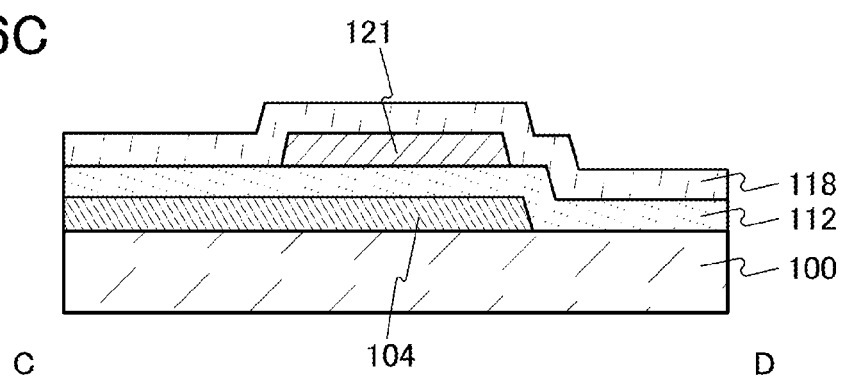

FIGS. 6A to 6C are a top view and cross-sectional views of a transistor which is an embodiment of the present invention. A cross section A-B in FIG. 6B and a cross section C-D in FIG. 6C correspond to alternate long and short dash lines A-B and C-D in FIG. 6A, respectively.

The cross section A-B in FIG. 6B will be described in detail below.

The cross-section A-B is a cross section of a transistor including a substrate 100, a gate electrode 104 over the substrate 100, a gate insulating film 112 over the gate electrode 104, a semiconductor film including a region 126 and a region 121 over the gate electrode 104 with the gate insulating film 112 interposed therebetween, an interlayer insulating film 118 that covers the semiconductor film and the gate insulating film 112, and a pair of electrodes 116 which is in contact with the region 126 at an opening that is provided in the interlayer insulating film 118 and exposes the region 126.

In the above-described manner, a transistor whose threshold voltage is controlled can be provided. Therefore, a semiconductor device having favorable electrical characteristics, high reliability, and low power consumption can be manufactured at high productivity.

This embodiment can be implemented in appropriate combination with any of the other embodiments.

(Embodiment 4)

In this embodiment, a liquid crystal display device manufactured using the transistor described in Embodiment 2 or 3 will be described. Note that an example in which an embodiment of the present invention is applied to a liquid crystal display device will be described in this embodiment; however, the present invention is not limited to this embodiment. For example, those skilled in the art can easily conceive an idea of applying an embodiment of the present invention to an electroluminescent (EL) display device.

Figure 7:
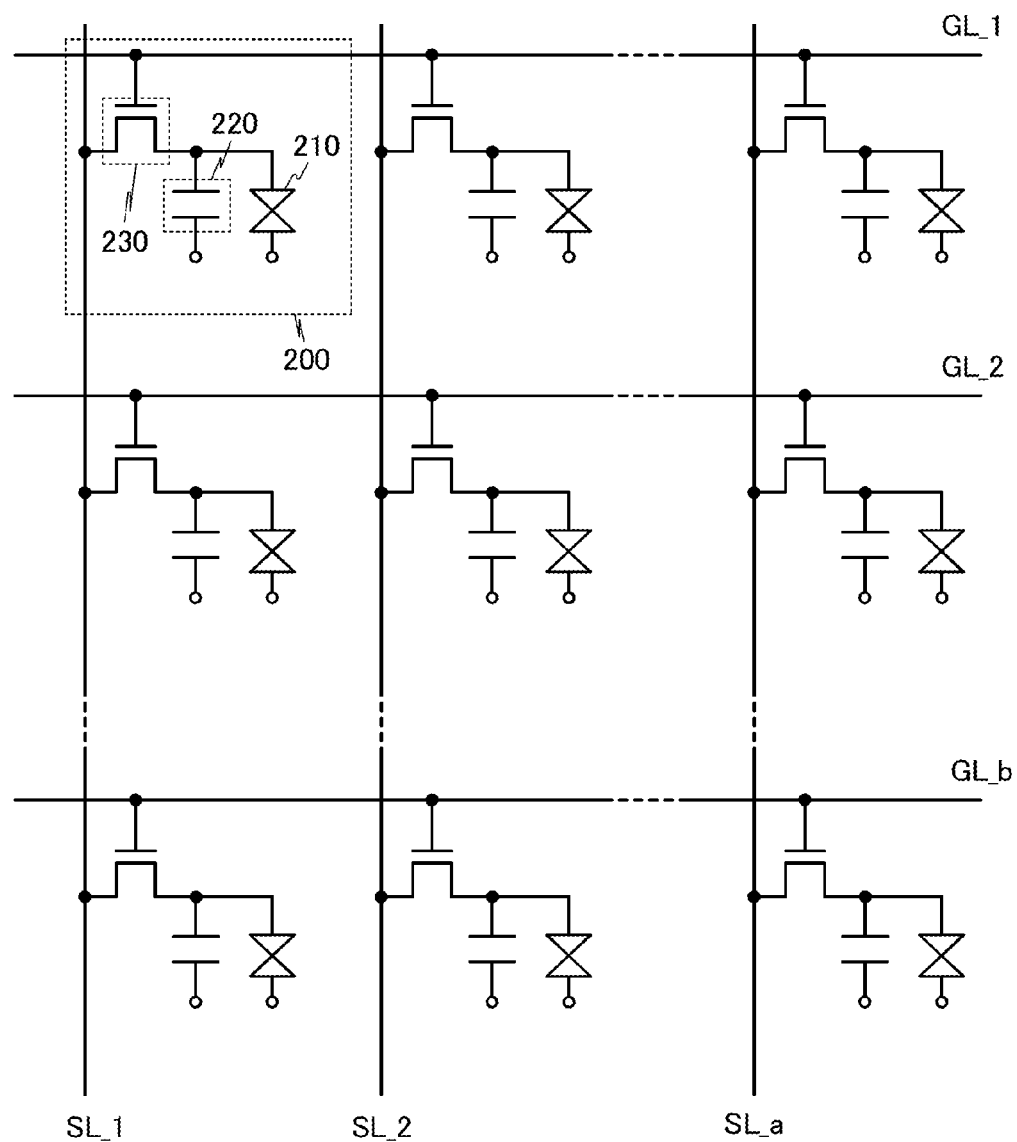
FIG. 7 is a circuit diagram showing an example of a liquid crystal display device including a transistor according to an embodiment of the present invention.

FIG. 7 is a circuit diagram of an active matrix liquid crystal display device. The liquid crystal display device includes source lines SL_1 to SL_a, gate lines GL_1 to GL_b, and a plurality of pixels 200. The pixels 200 each include a transistor 230, a capacitor 220, and a liquid crystal element 210. The plurality of pixels 200 with such a structure forms a pixel portion of the liquid crystal display device. Note that a "source line SL" and a "gate line GL" simply refer to a source line and a gate line, respectively.

The transistor described in Embodiment 2 or 3 is used as the transistor 230.

The gate line GL is connected to a gate of the transistor 230, the source line SL is connected to a source of the transistor 230, and a drain of the transistor 230 is connected to one capacitor electrode of the capacitor 220 and one pixel electrode of the liquid crystal element 210. The other capacitor electrode of the capacitor 220 and the other pixel electrode of the liquid crystal element 210 are connected to a common electrode. Note that the common electrode may be formed in the same layer as the gate line GL using the same material as the gate line GL.

Further, the gate line GL is connected to a gate driver circuit. The gate driver circuit may include the transistor described in Embodiment 2 or 3. Since the threshold voltage of the transistor is controlled, the off-state current of the transistor can be made to be small and the voltage for turning on the transistor can be made to be low. Thus, power consumption can be reduced.

The source line SL is connected to a source driver circuit. The source driver circuit may include the transistor described in Embodiment 2 or 3. Since the threshold voltage of the transistor is controlled, the off-state current of the transistor can be made to be small and the voltage for turning on the transistor can be made to be low. Thus, power consumption can be reduced.

Note that either or both of the gate driver circuit and the source driver circuit may be formed over a separately prepared substrate and connected using a method such as chip on glass (COG), wire bonding, or tape automated bonding (TAB).

Since a transistor is easily broken by static electricity or the like, a protection circuit is preferably provided. The protection circuit is preferably formed using a nonlinear element.

On application of a potential that is higher than the threshold voltage of the transistor 230 to the gate line GL, electric charge supplied from the source line SL flows as a drain current of the transistor 230 and is accumulated in the capacitor 220. After charging for one row, the transistors 230 in the row are turned off and voltage application from the source line SL stops; however, a necessary voltage can be kept by the electric charge accumulated in the capacitors 220. Then, charging of the capacitors 220 in the next row starts. In this manner, charging for the first row to the b-th row is carried out.

Since the transistor 230 is a transistor whose threshold voltage is controlled, electric charge held in the capacitor 220 is unlikely to be lost, and therefore the capacity of the capacitor 220 can be reduced; accordingly, power consumed for charging can be reduced.

In the case of using a transistor having a small off-state current (such as a transistor including an oxide semiconductor film) as the transistor 230, the period for which the voltage can be kept can be lengthened. By this effect, the display rewriting frequency can be reduced in the case of displaying an image with little motion (including a still image); accordingly, further reduction of the power consumption is possible. Further, the capacity of the capacitor 220 can be further reduced; accordingly, power consumed for charging can be reduced.

In the above-described manner, according to an embodiment of the present invention, a liquid crystal display device which consumes low power can be provided.

This embodiment can be implemented in appropriate combination with any of the other embodiments.

(Embodiment 5)

In this embodiment, an example of manufacturing a semiconductor memory device using the transistor described in Embodiment 2 or 3 will be described.

As typical examples of a volatile semiconductor memory device, there are a dynamic random access memory (DRAM) which stores data in such a manner that a transistor included in a memory element is selected and electric charge is accumulated in a capacitor, and a static random access memory (SRAM) which holds stored data using a circuit such as a flip-flop.

As a typical example of a nonvolatile semiconductor memory device, there is a flash memory which includes a floating gate between a gate electrode and a channel formation region in a transistor and stores data by holding electric charge in the floating gate.

The transistor described in Embodiment 2 or 3 can be applied to part of transistors included in the above-described semiconductor memory device.

First, a volatile memory to which the transistor described in Embodiment 2 or 3 is applied will be described with reference to FIGS. 8A and 8B.

Figure 8A:
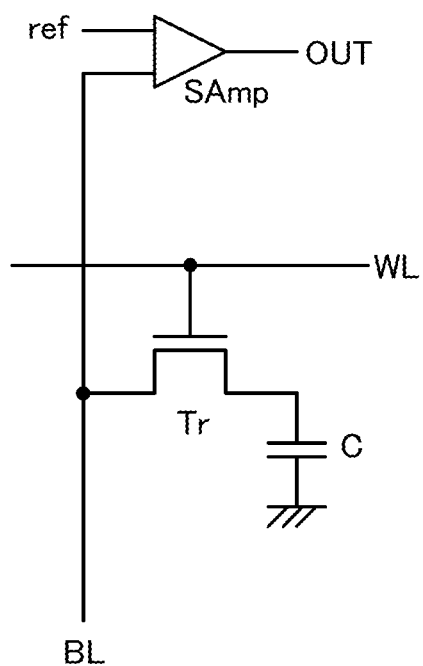
FIG. 8A is a circuit diagram showing an example of a semiconductor memory device including a transistor according to an embodiment of the present invention.

A memory cell includes a bit line BL, a word line WL, a sense amplifier SAmp, a transistor Tr, and a capacitor C (see FIG. 8A).

Figure 8B:
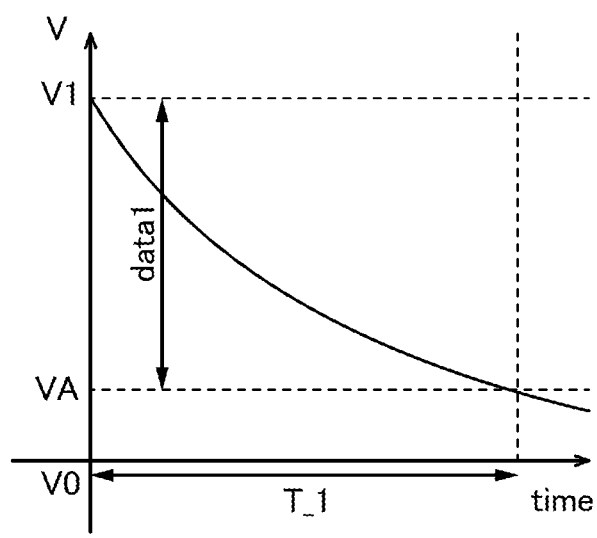
FIG. 8B shows electrical characteristics thereof.

It is known that the potential held in the capacitor is gradually decreased with time as shown in FIG. 8B owing to the off-state current of the transistor Tr. The potential charged from V0 to V1 is decreased with time, to VA that is a limit for reading out data 1. This period is called a holding period Tr_1. In the case of a two-level DRAM, refresh needs to be performed within the holding period Tr_1.

Since the threshold voltage of the transistor described in Embodiment 2 or 3 is controlled, if the transistor described in Embodiment 2 or 3 is used as the transistor Tr here, the holding period Tr_1 can be lengthened. That is, the frequency of refresh operation can be reduced. Accordingly, power consumption can be reduced.

In the case of using a transistor having a small off-state current as the transistor Tr, the period for which the voltage is kept can be further lengthened, so that power consumption can be further reduced. For example, in the case where a memory cell is formed using a transistor including an oxide semiconductor film with an off-state current of $1\times10^{-21}$ A or less, preferably $1\times10^{-24}$ A or less, data can be kept for several days to several tens of years without supply of electric power.

As described above, using an embodiment of the present invention, a DRAM having high reliability and low power consumption can be provided.

Next, a nonvolatile memory to which the transistor described in Embodiment 2 or 3 is applied will be described with reference to FIGS. 9A and 9B.

Figure 9A:
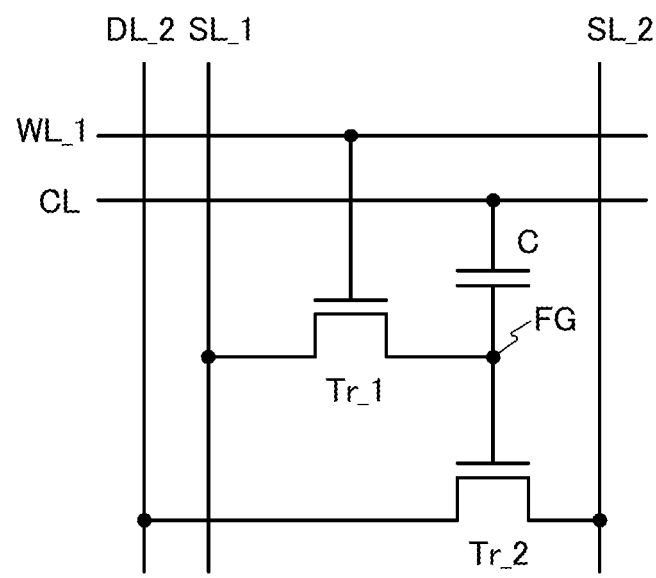
FIG. 9A is a circuit diagram showing an example of a semiconductor memory device including a transistor according to an embodiment of the present invention.

FIG. 9A is a circuit diagram of a nonvolatile memory. A memory cell includes a transistor Tr_1, a word line WL_1 connected to a gate of the transistor Tr_1, a source wiring SL_1 connected to a source of the transistor Tr_1, a transistor Tr_2, a source wiring SL_2 connected to a source of the transistor Tr_2, a drain wiring DL_2 connected to a drain of the transistor Tr_2, a capacitor C, a capacitor wiring CL connected to one terminal of the capacitor C, and a floating gate FG connected to the other terminal of the capacitor C, a drain of the transistor Tr_1, and a gate of the transistor Tr_2.

The nonvolatile memory described in this embodiment utilizes variation in the threshold of the transistor Tr_2 in accordance with the potential of the floating gate FG. For example, FIG. 9B shows a relation between a potential $V_{CL}$ of the capacitor wiring CL and a drain current $I_D\_2$ flowing through the transistor Tr_2.

Here, the potential of the floating gate FG can be adjusted through the transistor Tr_1. For example, an initial state of the potential of the floating gate FG is set to LOW, and the potential of the source line SL_1 is set to VDD. At this time, by setting the potential of the word line WL_1 to a potential that is higher than or equal to the sum of the threshold voltage of the transistor Tr_1 and VDD, the potential of the floating gate FG can be set to HIGH. On the other hand, in the case that the potential of the word line WL_1 is set to a potential equal to or lower than the threshold voltage of the transistor Tr_1, the potential of the floating gate FG remains in LOW.

Figure 9B:
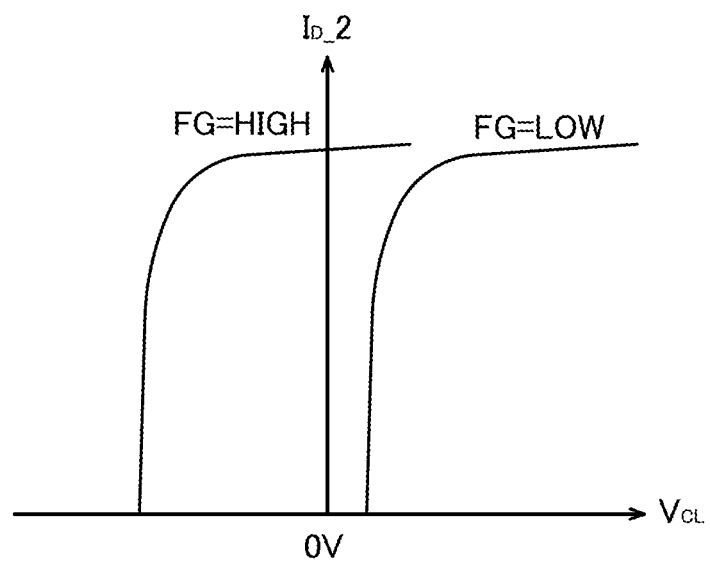
FIG. 9B shows electrical characteristics thereof.

Thus, as shown in FIG. 9B, either a $V_{CL}$-$I_D\_2$ curve for FG=LOW or a $V_{CL}$-$I_D\_2$ curve for FG=HIGH can be obtained. That is, when FG=LOW, the $I_D\_2$ is small at a $V_{CL}$ of 0 V; accordingly, data 0 is stored. Further, when FG=HIGH, the $I_D\_2$ is large at a $V_{CL}$ of 0V; accordingly, data 1 is stored. In this manner, data can be stored.

Since the off-state current of the transistor described in Embodiment 2 or 3 can be made to be extremely small, if the transistor described in Embodiment 2 or 3 is used as the transistor Tr_1 here, unintentional leak of electric charge accumulated in the floating gate FG through the transistor Tr_1 can be suppressed. Therefore, data can be held for a long period. By using an embodiment of the present invention, the threshold voltage of the transistor Tr_1 is controlled, which enables reduction in the voltage necessary for writing. Thus, power consumption can be made small as compared to a flash memory or the like.

Note that the transistor described in Embodiment 2 or 3 may also be applied to the transistor Tr_2.

This embodiment can be implemented in appropriate combination with any of the other embodiments.

(Embodiment 6)

In this embodiment, examples of electronic equipment to which any of Embodiments 2 to 5 is applied will be described.

Figure 10A:
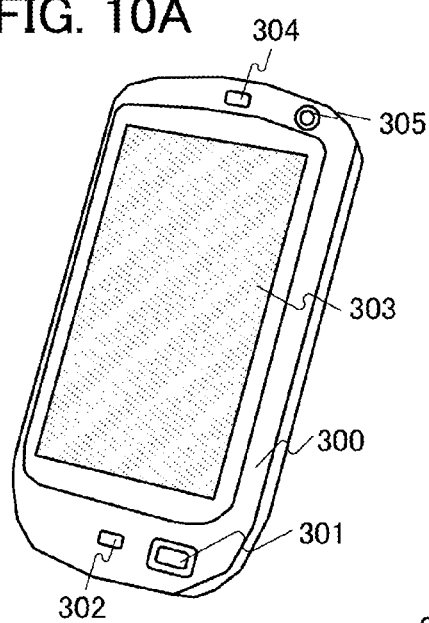
FIGS. 10A to 10C each show an example of an electronic device according to an embodiment of the present invention.

FIG. 10A illustrates a portable information terminal. The portable information terminal includes a housing 300, a button 301, a microphone 302, a display portion 303, a speaker 304, and a camera 305, and has a function as a mobile phone. An embodiment of the present invention can be applied to the display portion 303 and the camera 305. Although not illustrated, an embodiment of the present invention can also be applied to an arithmetic unit, a wireless circuit, or a memory circuit inside the main body.

Figure 10B:
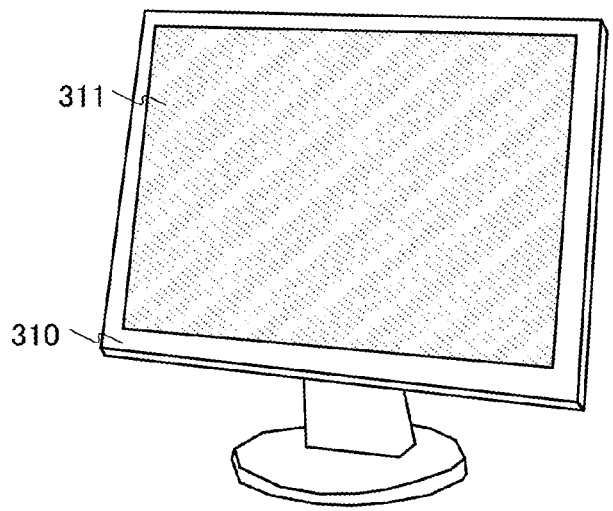

FIG. 10B illustrates a display. The display includes a housing 310 and a display portion 311. An embodiment of the present invention can be applied to the display portion 311. When an embodiment of the present invention is employed, a display having low power consumption can be provided.

Figure 10C:
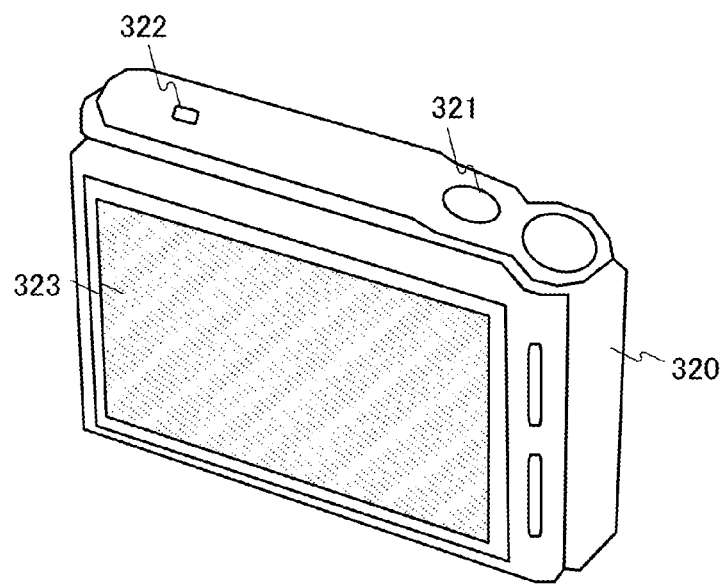
Figure 11A:
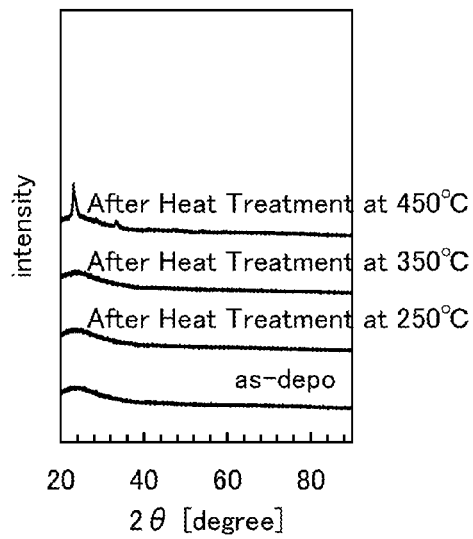
FIGS. 11A to 11D show XRD spectra of tungsten oxide films.
Figure 11B:
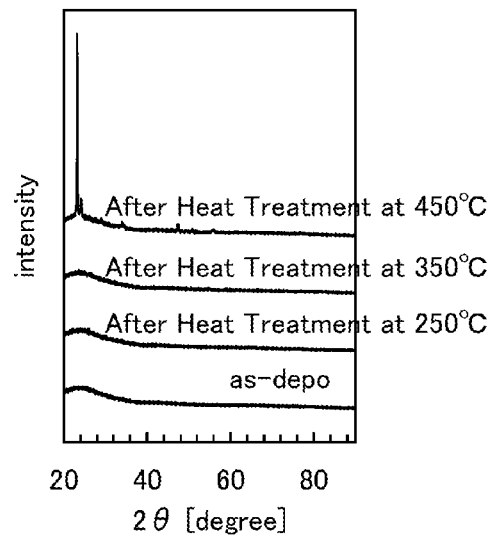
Figure 11C:
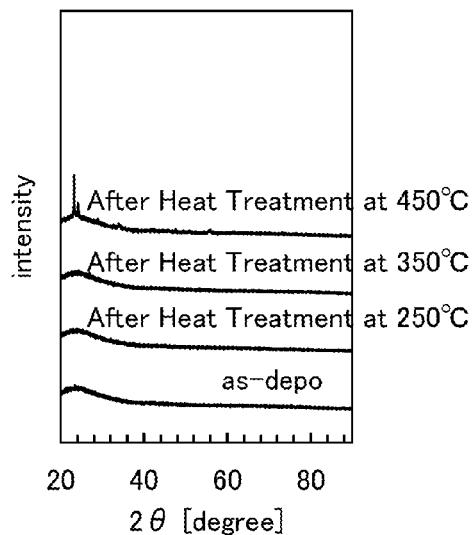
Figure 11D:
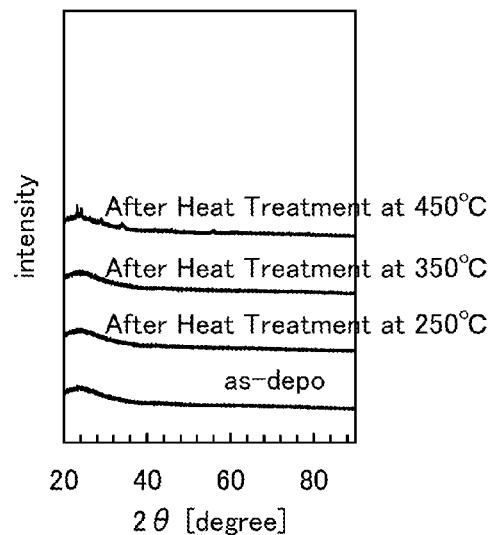
Figure 12A:
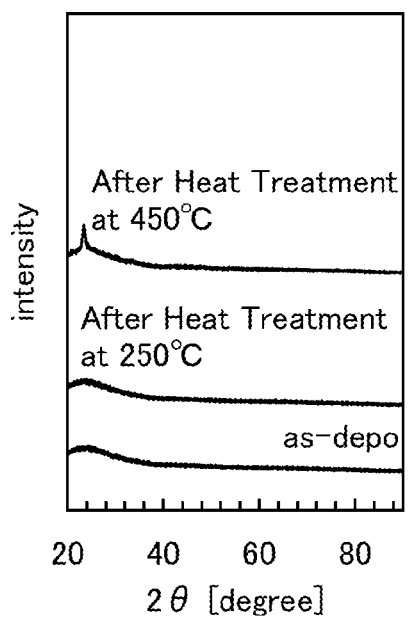
FIGS. 12A to 12D show XRD spectra of tungsten oxide films.
Figure 12B:
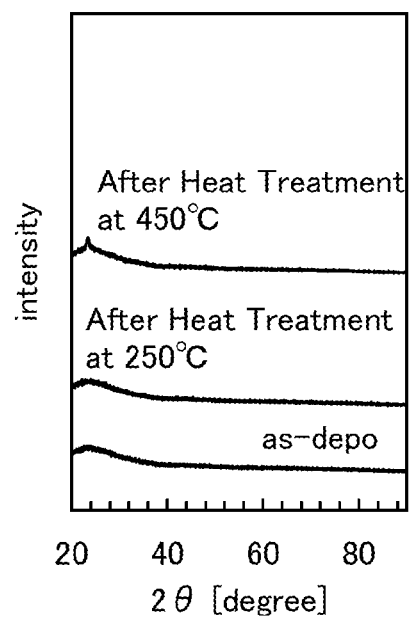
Figure 12C:
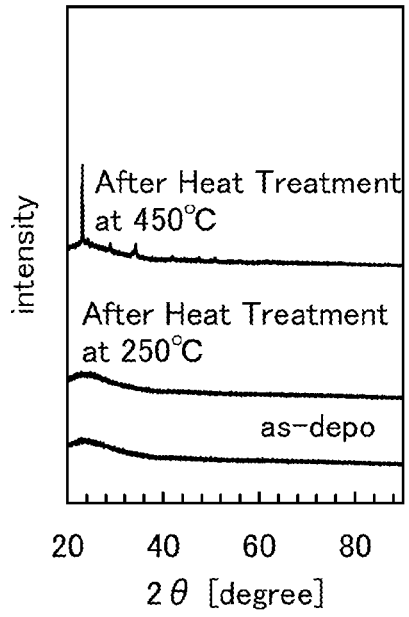
Figure 12D:
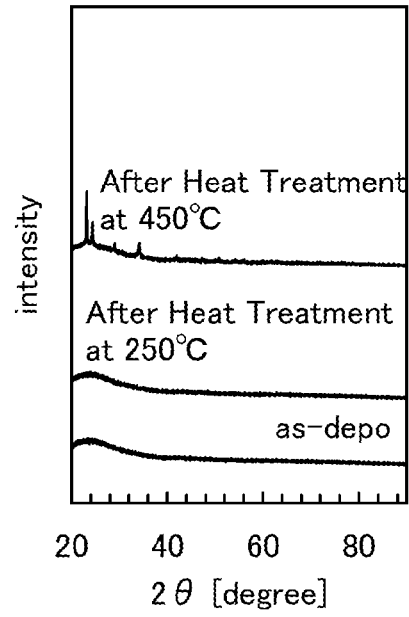

FIG. 10C illustrates a digital still camera. The digital still camera includes a housing 320, a button 321, a microphone 322, and a display portion 323. An embodiment of the present invention can be applied to the display portion 323. Although not illustrated, an embodiment of the present invention can also be applied to a memory circuit or an image sensor.

When an embodiment of the present invention is employed, power consumption of an electronic equipment can be reduced.

This embodiment can be implemented in appropriate combination with any of the other embodiments.

Example 1

In this example, a relation among the crystallinity, composition, and work function of a tungsten oxide film formed using an embodiment of the present invention will be described.

First, the crystallinity of a tungsten oxide film was evaluated with an X-ray diffractometer (manufactured by Bruker AXS, D8 ADVANCE).

Samples were made by a DC sputtering method using a $WO_3$ target. Other conditions were such that the film formation electric power was 1 kW, the film formation pressure was 0.4 Pa, the substrate temperature was room temperature, and the thickness was 100 nm.

Here, flow rates of film formation gas of the samples are shown in Table 1.

TABLE 1

| Name of sample | Flow rate of gas [sccm] | | |
|---|---|---|---|
| | Ar | $O_2$ | $N_2$ |
| Sample 1 | 30 | 0 | 0 |
| Sample 2 | 25 | 5 | 0 |
| Sample 3 | 20 | 10 | 0 |
| Sample 4 | 15 | 15 | 0 |
| Sample 5 | 25 | 0 | 5 |
| Sample 6 | 20 | 0 | 10 |
| Sample 7 | 20 | 5 | 5 |
| Sample 8 | 10 | 10 | 10 |

FIGS. 11A to 11D respectively show XRD spectra of Samples 1 to 4 obtained by an out-of-plane method. Note that FIGS. 11A to 11D each show XRD spectra of the as-deposited sample, the sample after heat treatment at 250° C., the sample after heat treatment at 350° C., and the sample after heat treatment at 450° C. The heat treatment was performed in an $N_2$ atmosphere for one hour. Here, the as-deposited sample is a sample that is not particularly subjected to heat treatment and the like after the tungsten oxide film is deposited.

From FIGS. 11A to 11D, it was found that the tungsten oxide films deposited using a film formation gas of Ar or a film formation gas of Ar and $O_2$ were amorphous at 350° C. or lower and crystallized at 450° C. or higher. Note that the crystallization temperature is not construed as being limited to this range and is expected to vary even with a slight change of the film formation conditions.

Next, FIGS. 12A to 12D respectively show XRD spectra of Samples 5 to 8 obtained by an out-of-plane method. Note that FIGS. 12A to 12D each show XRD spectra of the as-deposited sample, the sample after heat treatment at 250° C., and the sample after heat treatment at 450° C. The heat treatment was performed in an $N_2$ atmosphere for one hour.

From FIGS. 12A to 12D, it was found that the samples formed using a film formation gas of Ar and $N_2$ or a film formation gas of Ar, $O_2$, and $N_2$ were amorphous at 250° C. or lower and crystallized at 450° C. or higher. Note that the crystallization temperature is not construed as being limited to this range and varies even with a slight change of the film formation conditions.

Figure 13A:
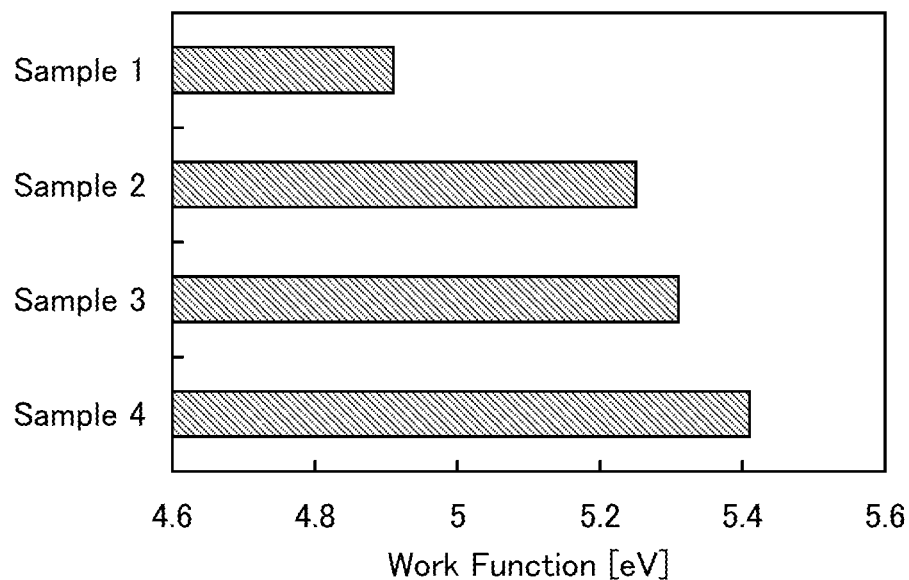
FIGS. 13A and 13B show work functions of tungsten oxide films.
Figure 13B:
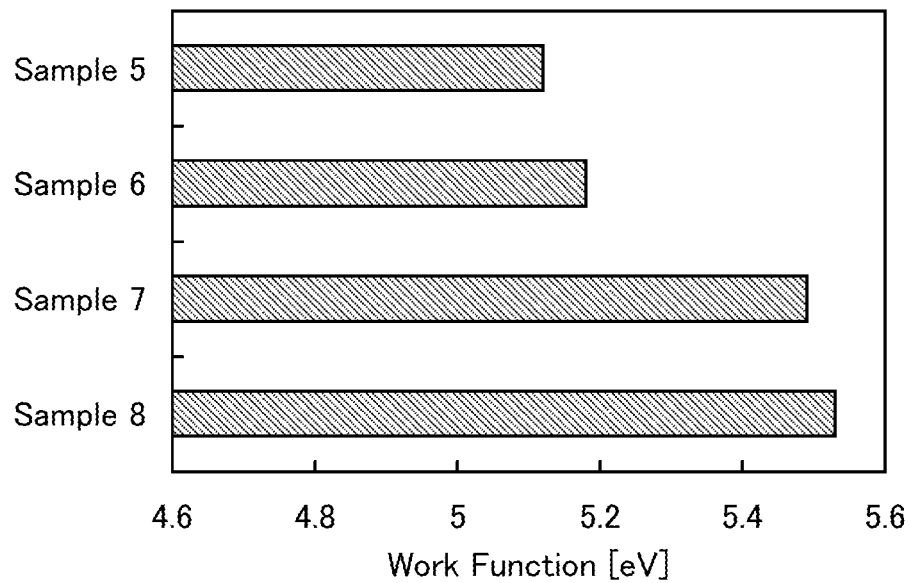

Next, the work functions of Samples 1 to 8 were evaluated with a photoelectron spectrometer AC-2 for use in air which was manufactured by Riken Keiki Co., Ltd. The results are shown in FIGS. 13A and 13B. FIG. 13A shows the work functions of Samples 1 to 4. FIG. 13B shows the work functions of Samples 5 to 8.

From the comparison of Samples 1 to 4, it can be seen that the work function increased in accordance with an increase in the proportion of $O_2$ to Ar in the film formation gas. Further, from the comparison of Samples 5 to 8, it can be seen that the work functions of the samples formed using a film formation gas of Ar, $O_2$, and $N_2$ were higher than those of the samples formed using a film formation gas of Ar and $N_2$ and in addition the work function slightly increased by an increase in the proportion of $N_2$. From the comparison of Samples 1 to 8, it can be seen that the work functions of the samples formed using a film formation gas of Ar and $O_2$ into which $N_2$ was mixed were higher than those of the samples formed using a film formation gas of Ar and $O_2$.

Thus, it was found that the tungsten oxide films whose work function can be controlled within a range of 4.9 eV to 5.6 eV can be obtained under the conditions of Samples 1 to 8.

Next, the compositions of Samples 1 to 8 were evaluated with 3S-R10 manufactured by NEC Corporation and RBS-400 manufactured by CEA. The results are shown in Table 2.

TABLE 2

| Name of Sample | Composition [atomic %] | | | | O/W ratio |
|---|---|---|---|---|---|
| | W | O | N | Ar | |
| Sample 1 | 23.0 | 75.2 | 0 | 1.8 | 3.27 |
| Sample 2 | 21.7 | 76.9 | 0 | 1.4 | 3.54 |
| Sample 3 | 20.4 | 78.4 | 0 | 1.2 | 3.84 |
| Sample 4 | 21.0 | 77.8 | 0 | 1.2 | 3.70 |
| Sample 5 | 22.4 | 66.1 | 10 | 1.5 | 2.95 |
| Sample 6 | 22.0 | 61.8 | 15 | 1.2 | 2.81 |
| Sample 7 | 20.9 | 72.8 | 5 | 1.3 | 3.48 |
| Sample 8 | 20.6 | 73.6 | 5 | 0.8 | 3.57 |

For reference, the ratio of O to W in the film (referred to as O/W ratio) is listed. From the comparison of Samples 1 to 4, it can be seen that the O/W ratio increased in accordance with an increase in the proportion of $O_2$ to Ar in the film formation gas.

This tendency is similar to that of the work function, and the work function increased when the O/W ratio in the film increased. Note that there is no correlation between the proportion of $O_2$ to Ar in the film formation gas and the O/W ratio in Sample 3 and Sample 4. This suggests the possibility that O taken into the film is saturated at a proportion of $O_2$ to Ar in the film formation gas which is between that of Sample 3 and that of Sample 4. Note that saturation of O taken into the film does not necessarily occur in the above-described range and occurs depending on the influence of other film formation conditions or the influence of an element other than W and O.

From the comparison of Samples 1 to 8, it can be seen that the O/W ratios of the samples formed using a film formation gas of Ar and $N_2$ were lower than those of the samples formed using a film formation gas of Ar and $O_2$. This suggests the possibility that N is substituted for O. Further, from the comparison of Samples 5 to 8, it can be seen that the O/W ratios of the samples formed using a film formation gas of Ar, $O_2$, and $N_2$ were higher than those of the samples formed using a film formation gas of Ar and $N_2$, although the percentages of N in the composition in the samples formed using a film formation gas of Ar, $O_2$, and $N_2$ are lower than those in the samples formed using a film formation gas of Ar and $N_2$. Also in the Samples 5 to 8, the work function increased when the O/W ratio in the film increased.

This example shows that the work function can be controlled by adjusting the composition of the tungsten oxide film.

Example 2

In this example, a tungsten oxide film formed using a bias sputtering method will be described. The bias sputtering method is a method in which ions collide with the substrate side in addition to collision of ions with the target side as in normal sputtering.

Samples were formed using a $WO_3$ target. Other conditions were such that the film formation electric power was 1 kW (DC), the film formation pressure was 0.4 Pa, the substrate temperature was room temperature, and the thickness was 100 nm.

Here, bias electric powers and flow rates of film formation gas of the samples are shown in Table 3.

TABLE 3

| Name of Sample | Bias electric power [W] | Flow rate of gas [sccm] | | |
|---|---|---|---|---|
| | | Ar | $O_2$ | $N_2$ |
| Sample 9 | 0 | 30 | 0 | 0 |
| Sample 10 | 100 | 30 | 0 | 0 |
| Sample 11 | 0 | 15 | 15 | 0 |
| Sample 12 | 50 | 15 | 15 | 0 |
| Sample 13 | 100 | 15 | 15 | 0 |
| Sample 14 | 200 | 15 | 15 | 0 |

Note that Sample 9 and Sample 11 are the same as Sample 1 and Sample 4 presented in Example 1, respectively.

Figure 14:
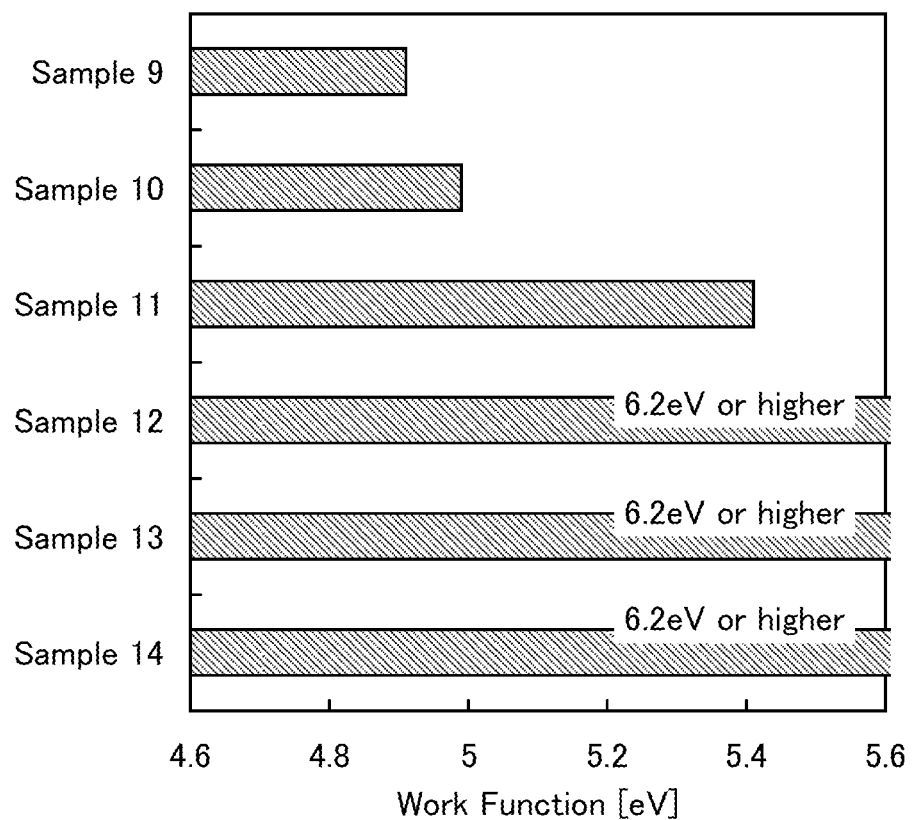
FIG. 14 shows work functions of tungsten oxide films.

When Sample 9 is compared with Sample 10 in FIG. 14, the work function of Sample 10 formed using a bias sputtering method is higher than that of Sample 9.

The work functions of Samples 12 to 14 were not able to be measured. Since there is a tendency of the work function to increase by use of a bias sputtering method, it is highly possible that the work functions of Samples 12 to 14 are higher than or equal to 6.2 eV that is a measurement limit of an apparatus.

According to this example, it can be found that the work function of the tungsten oxide film formed using a bias sputtering method is highly possibly 6.2 eV or higher and thus the work function can be controlled in a wider range than the range described in Example 1.

Example 3

In this example, a tungsten oxide film formed using plasma oxidation treatment will be described.

Figure 17:
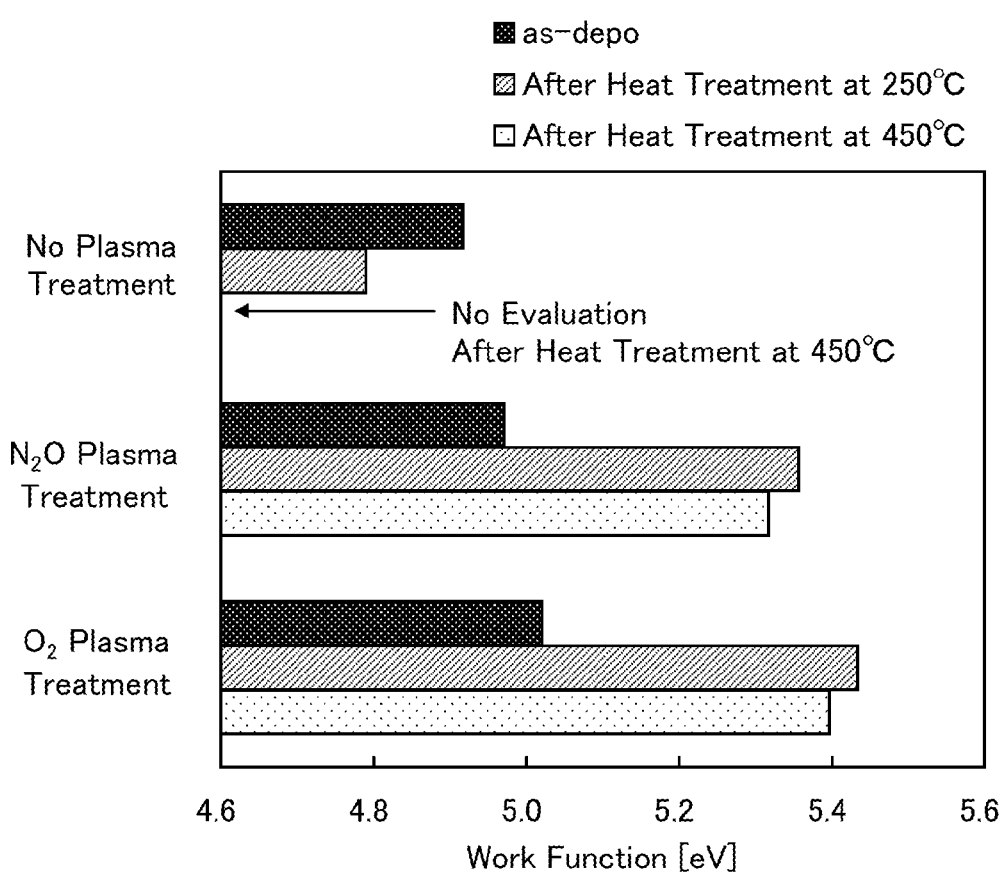
FIG. 17 shows work functions of tungsten oxide films.

FIG. 17 shows evaluation results of the work functions of a tungsten film which is not subjected to plasma treatment, a tungsten oxide film formed by subjecting a tungsten film to $N_2O$ plasma treatment, and a tungsten oxide film formed by subjecting a tungsten film to $O_2$ plasma treatment, in the as-deposited state, after heat treatment at 250° C., and after heat treatment at 450° C. The heat treatment was performed in an $N_2$ atmosphere for one hour.

Here, the tungsten film was formed by a sputtering method using a W target. Other conditions were such that the film formation electric power was 6 kW, the film formation pressure was 1.5 Pa, and Ar (110 sccm) was used as a film formation gas.

The $N_2O$ plasma treatment was performed with a CVD apparatus by exposure for 120 seconds to plasma that was generated using $N_2O$ (500 sccm) as a reaction gas at an electric power of 500 W, a pressure of 133.3 Pa, and a substrate temperature of 400° C.

The $O_2$ plasma treatment was performed with a CVD apparatus by exposure for 120 seconds to plasma that was generated using $O_2$ (500 sccm) as a reaction gas at an electric power of 500 W, a pressure of 133.3 Pa, and a substrate temperature of 400° C.

The heat treatment at 250° C. and the heat treatment at 450° C. were performed in an $N_2$ atmosphere for one hour.

From FIG. 17, it can be seen that the work functions of the tungsten oxide films formed by subjecting a tungsten film to the $N_2O$ plasma treatment or the $O_2$ plasma treatment were higher than that of the tungsten film without plasma treatment. It can also be seen that as compared to the work functions of the as-deposited tungsten oxide films formed by subjecting a tungsten film to the N$_2$O plasma treatment or the O$_2$ plasma treatment, the work functions of the tungsten oxide films after the heat treatment at 250° C. or the heat treatment at 450° C. were higher. Further, the work function of the tungsten oxide film formed by subjecting a tungsten film to the O$_2$ plasma treatment was higher than that of the tungsten oxide film formed by subjecting a tungsten film to the N$_2$O plasma treatment although the difference was small.

Figure 18:
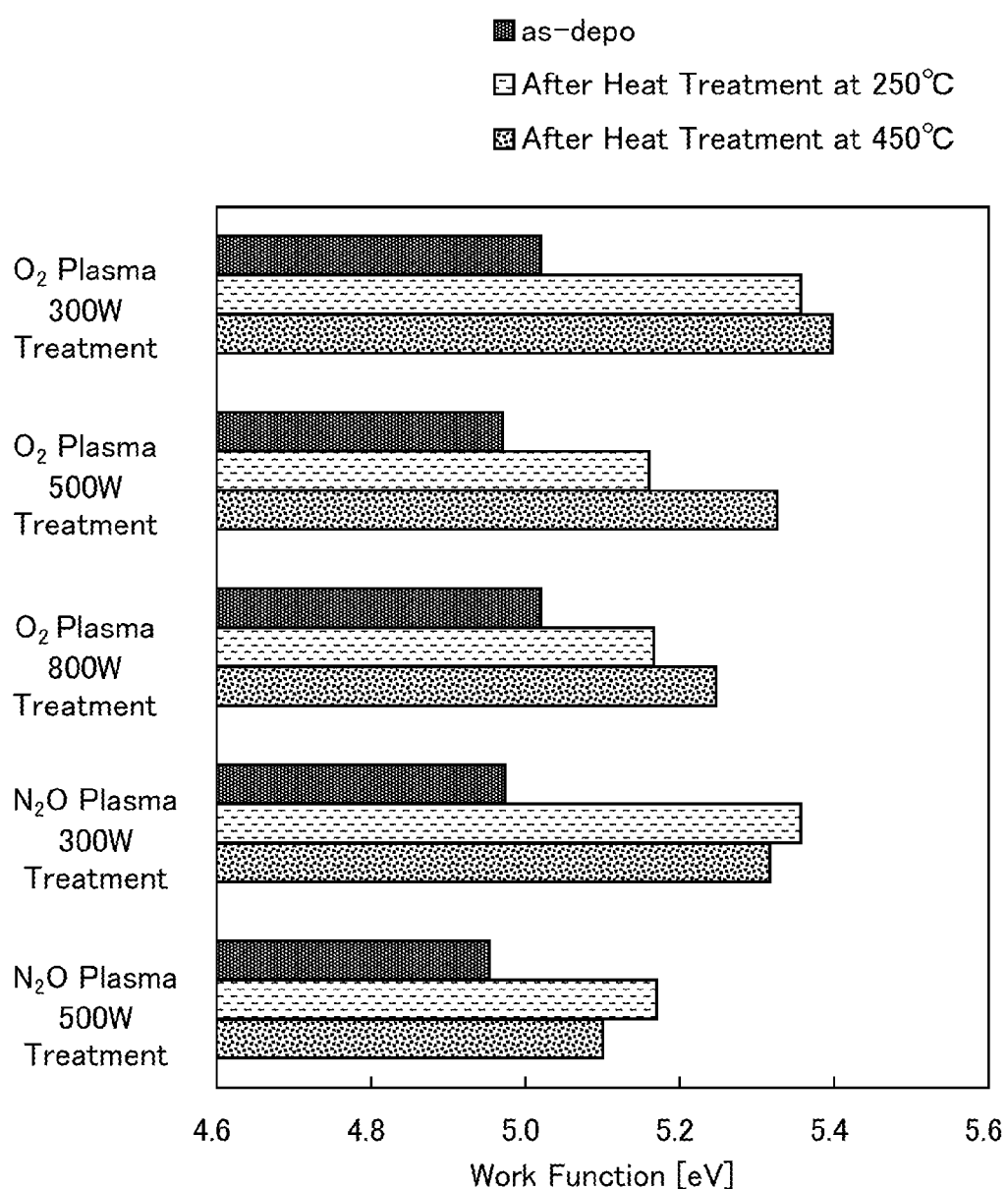
FIG. 18 shows work functions of tungsten oxide films.

Next, FIG. 18 shows work functions of tungsten oxide films obtained by setting the electric power in performing the O$_2$ plasma treatment or the N$_2$O plasma treatment on a tungsten oxide film at 300 W, 500 W, and 800 W.

FIG. 18 shows that the work functions of the tungsten oxide films after the heat treatment at 250° C. or the heat treatment at 450° C. were higher than the work function of the as-deposited tungsten oxide film in any of the conditions. In addition, the work function decreases at higher electric power in any of the conditions.

According to this example, it can be found that the work function of a tungsten oxide film formed by oxidation with plasma treatment can be controlled with a combination of the kind of a reaction gas of plasma, the electric power, and conditions of heat treatment.

Example 4

Figure 15:
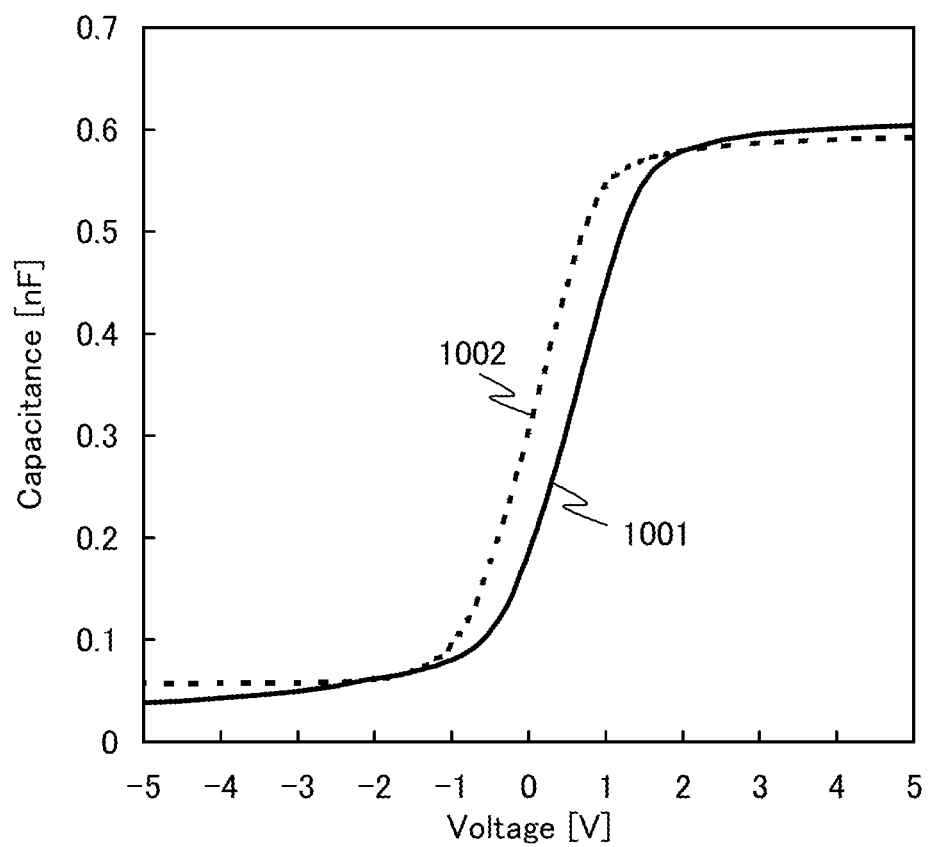
FIG. 15 shows a C-V curve of a MOS structure that uses a tungsten oxide film as part of its gate electrode.

In this example, as an example, a metal oxide semiconductor (MOS) structure was formed using a tungsten oxide film as part of a gate electrode, and capacitance-voltage (C-V) measurement was conducted. The results are shown in FIG. 15.

Note that a method of forming the MOS structure is as follows.

First, a thermal oxidation film is provided with a thickness of 50 nm for an n-type silicon wafer, and a gate electrode is formed over the thermal oxidation film. Then, the thermal oxidation film on the rear surface of the n-type silicon wafer is removed with hydrofluoric acid, and an Al-Ti alloy is deposited on the rear surface of the n-type silicon wafer as a rear surface electrode. Further, heat treatment is performed at 250° C. in an N$_2$ atmosphere for 1 hour. In this manner, samples were formed.

Note that the gate electrode was formed using a metal mask so as to have a circular shape with a diameter of 1 mm.

In FIG. 15, a solid line 1001 is a C-V curve of a sample having a gate electrode with a stacked structure of a 10-nm-thick tungsten oxide film and 140-nm-thick tungsten film. Here, the tungsten oxide film was formed by a DC sputtering method using a WO$_3$ target. Other conditions were such that the film formation electric power was 0.25 kW, the film formation pressure was 0.4 Pa, Ar (30 sccm) was used as a film formation gas, and the substrate temperature was room temperature.

For comparison, a C-V curve of a sample having a gate electrode with a stacked structure of a 15-nm-thick tantalum nitride film and 135-nm-thick tungsten film, which is indicated by a broken line 1002, is also shown.

Table 4 shows work functions and flat-band voltages (V$_{fb}$) of the tungsten oxide film (Sample 16) and the tantalum nitride film (Sample 15), which were used in this example.

TABLE 4

| Name of Sample | Work function [eV] | V$_{fb}$ [V] |
|---|---|---|
| Sample 15 | 4.70 | 0.37 |
| Sample 16 | 5.01 | 0.90 |

It can be understood from Table 4 that V$_{fb}$ and the work function of the gate electrode, which were obtained by the C-V measurement of the MOS structure, correspond to each other.

Example 5

In this example, an example of manufacturing a transistor using a tungsten oxide film as part of a gate electrode will be described with reference to FIGS. 3A to 3C and FIGS. 16A and 16B.

The transistor has a structure illustrated in FIGS. 3A to 3C and includes a silicon oxide film with a thickness of 300 nm formed by a sputtering method as a base insulating film 102, an In—Ga—Zn—O film with a thickness of 20 nm formed by a sputtering method using an In—Ga—Zn—O target (with a molar ratio of In$_2$O$_3$:Ga$_2$O$_3$:ZnO=1:1:2) as a semiconductor film 106, a tungsten film with a thickness of 50 nm formed by a sputtering method as a pair of electrodes 116, and a silicon oxynitride film with a thickness of 15 nm formed by a CVD method as a gate insulating film 112. Although not shown, the transistor is covered with a silicon oxynitride film with a thickness of 300 nm which is formed by a CVD method.

Here, gate voltage-drain current (V$_g$-I$_d$) measurement of a transistor (Sample 18) having a gate electrode with a stacked structure of the tungsten oxide film with a thickness of 10 nm described in Example 3 and a tungsten film with a thickness of 140 nm and a transistor (Sample 17) having a gate electrode with a stacked structure of a tantalum nitride film with a thickness of 15 nm and a tungsten film with a thickness of 135 nm was performed. Note that the channel width of the transistors was 10 μm and the channel length was 3 μm. The results are shown in FIGS. 16A and 16B.

Figure 16A:
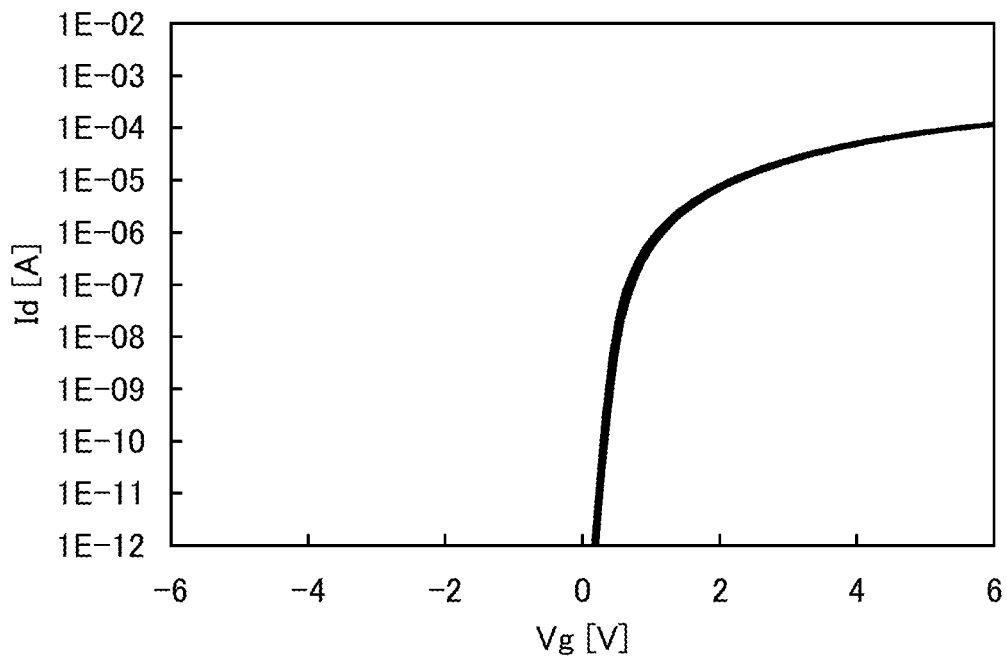
FIGS. 16A and 16B each show a Vg-Id curve of a transistor.
Figure 16B:
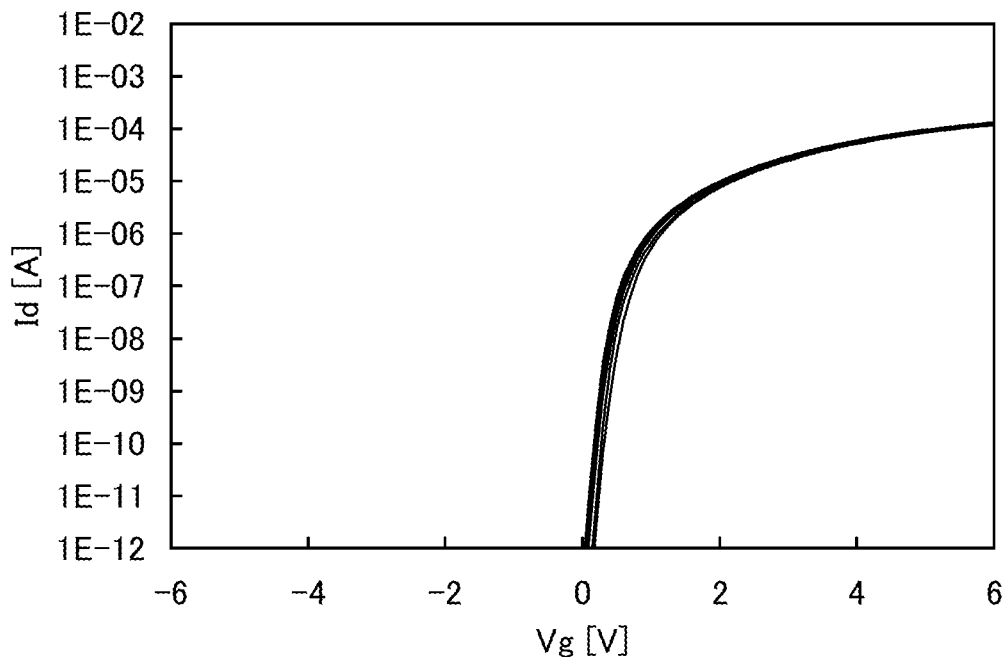

FIG. 16A shows a V$_g$-I$_d$ curve of Sample 18, and FIG. 16B shows a V$_g$-I$_d$ curve of Sample 17.

Table 5 shows work functions of the film on the gate insulating film 112 side of the films that are used as the gate electrode and threshold voltages obtained from V$_g$-I$_d$ measurement of Samples 17 and 18.

TABLE 5

| Name of Sample | Work function [eV] | V$_{th}$ [V] |
|---|---|---|
| Sample 17 | 4.70 | 0.66 |
| Sample 18 | 5.01 | 0.89 |

Table 5 shows that the work function and the threshold voltage which was obtained by V$_g$-I$_d$ measurement of the transistors correspond to each other.

Thus, it is found that the threshold voltage of a transistor can be controlled by controlling the work function of a tungsten oxide film.

This application is based on Japanese Patent Application serial no. 2010-282166 filed with Japan Patent Office on Dec. 17, 2010, the entire contents of which are hereby incorporated by reference.

What is claimed is:
1. A semiconductor device comprising:
a gate electrode essentially consisting of a tungsten oxide;
a gate insulating film in contact with the gate electrode; and an oxide semiconductor film part of which at least overlaps with the gate electrode with the gate insulating film interposed therebetween,
wherein a work function of the gate electrode is higher than or equal to 4.9 eV and lower than or equal to 5.6 eV, and
wherein the oxide semiconductor film includes two or more elements selected from In, Ga, Zn, Sn, and Al.

2. The semiconductor device according to claim 1, further comprising a pair of electrodes between the oxide semiconductor film and the gate insulating film.

3. The semiconductor device according to claim 1,
wherein the oxide semiconductor film is provided over a base insulating film, and
wherein a pair of electrodes is included between the oxide semiconductor film and the base insulating film.

4. The semiconductor device according to claim 1, further comprising:
an interlayer insulating film over the oxide semiconductor film; and
a pair of electrodes between the oxide semiconductor film and the interlayer insulating film.

5. The semiconductor device according to claim 1, wherein the gate electrode is formed by a sputtering method using one or more gases selected from a rare gas, oxygen, and nitrogen as a gas included in a film formation gas.

6. The semiconductor device according to claim 1, wherein the gate electrode includes nitrogen at greater than or equal to 0.1 at % and lower than or equal to 20 at %.

7. The semiconductor device according to claim 1, wherein the gate electrode is formed by performing oxidation treatment on a film including tungsten.

8. The semiconductor device according to claim 1, wherein the work function of the gate electrode is higher than or equal to 5.2 eV and lower than or equal to 5.6 eV.

9. A semiconductor device comprising:
a gate electrode including a first film comprising tungsten, oxygen and nitrogen, wherein a concentration of nitrogen in the first film is higher than or equal to 0.1 at % and lower than or equal to 20 at %;
a gate insulating film in contact with the tungsten oxide first film; and
an oxide semiconductor film part of which at least overlaps with the gate electrode with the gate insulating film interposed therebetween,
wherein a work function of the gate electrode is higher than or equal to 4.9 eV and lower than or equal to 5.6 eV, and
wherein the oxide semiconductor film includes two or more elements selected from In, Ga, Zn, Sn, and Al.

10. The semiconductor device according to claim 9, further comprising a pair of electrodes between the oxide semiconductor film and the gate insulating film.

11. The semiconductor device according to claim 9,
wherein the oxide semiconductor film is provided over a base insulating film, and
wherein a pair of electrodes is included between the oxide semiconductor film and the base insulating film.

12. The semiconductor device according to claim 9, further comprising:
an interlayer insulating film over the oxide semiconductor film; and
a pair of electrodes between the oxide semiconductor film and the interlayer insulating film.

13. The semiconductor device according to claim 9, wherein the first film is formed by a sputtering method using one or more gases selected from a rare gas, oxygen, and nitrogen as a gas included in a film formation gas.

14. The semiconductor device according to claim 9, wherein the film further comprises argon.

15. The semiconductor device according to claim 9, wherein the first film is formed by performing oxidation treatment on a film including tungsten.

16. The semiconductor device according to claim 9, wherein the work function of the gate electrode is higher than or equal to 5.2 eV and lower than or equal to 5.6 eV.

17. The semiconductor device according to claim 9, wherein the gate electrode includes a second film comprising any one of Al, Ti, Cr, Co, Ni, Cu, Y, Zr, Mo, Ag, and Ta.

18. The semiconductor device according to claim 1, wherein the gate electrode is formed by a sputtering method using two or more targets selected from tungsten target, tungsten dioxide target, tungsten trioxide target, and target of tungsten oxide with another valence.

19. The semiconductor device according to claim 9, wherein the first film is formed by a sputtering method using two or more targets selected from tungsten target, tungsten dioxide target, tungsten trioxide target, and target of tungsten oxide with another valence.

20. A semiconductor device comprising:
an oxide semiconductor film comprising a first region and a second region;
a gate insulating film overlapping with the first region and not overlapping with the second region; and
a gate electrode overlapping with the oxide semiconductor film with the gate insulating film interposed therebetween,
wherein the gate electrode essentially consists of a tungsten oxide,
wherein resistance of the second region is lower than that of the first region
wherein a work function of the gate electrode is higher than or equal to 4.9 eV and lower than or equal to 5.6 eV, and
wherein the oxide semiconductor film includes two or more elements selected from In, Ga, Zn, Sn, and Al.

21. The semiconductor device according to claim 20, further comprising:
an interlayer insulating film over the oxide semiconductor film; and
a pair of electrodes over the interlayer insulating film and in contact with the oxide semiconductor film.

22. The semiconductor device according to claim 21, wherein the pair of electrodes in contact with the oxide semiconductor film through a plurality of openings formed in the interlayer insulating film.

23. The semiconductor device according to claim 20, wherein the gate electrode is formed by a sputtering method using one or more gases selected from a rare gas, oxygen, and nitrogen as a gas included in a film formation gas.

24. The semiconductor device according to claim 20, wherein the gate electrode includes nitrogen at greater than or equal to 0.1 at % and lower than or equal to 20 at %.

25. The semiconductor device according to claim 20, wherein the gate electrode is formed by performing oxidation treatment on a film including tungsten.

26. The semiconductor device according to claim 20, wherein the work function of the gate electrode is higher than or equal to 5.2 eV and lower than or equal to 5.6 eV.

27. The semiconductor device according to claim 20, wherein the gate electrode is formed by a sputtering method using two or more targets selected from tungsten target, tungsten dioxide target, tungsten trioxide target, and target of tungsten oxide with another valence.

* * * * *

UNITED STATES PATENT AND TRADEMARK OFFICE
CERTIFICATE OF CORRECTION

PATENT NO. : 9,202,822 B2  Page 1 of 1
APPLICATION NO. : 13/316604
DATED : December 1, 2015
INVENTOR(S) : Yuta Endo et al.

It is certified that error appears in the above-identified patent and that said Letters Patent is hereby corrected as shown below:

In the Specification

Column 14, line 22, replace "Tr_1" with --T_1--;

Column 14, line 24, replace "Tr_1" with --T_1--;

Column 14, line 28, replace "Tr_1" with --T_1--;

Column 15, line 8, replace "0 V;" with --0V;-- and

In the Claims

Column 21, line 40, in claim 9, delete "tungsten oxide".

Signed and Sealed this
Twenty-sixth Day of April, 2016

Michelle K. Lee
*Director of the United States Patent and Trademark Office*